US012648081B2

(12) United States Patent
Kuwabara et al.

(10) Patent No.: US 12,648,081 B2
(45) Date of Patent: Jun. 2, 2026

(54) PRINTED WIRING BOARD

(71) Applicant: IBIDEN CO., LTD., Ogaki (JP)

(72) Inventors: Masashi Kuwabara, Ibi-gun (JP);
Susumu Kagohashi, Ogaki (JP); **Jun
Sakai, Ogaki (JP); Takuya Inishi**,
Ibi-gun (JP); Kyohei Yoshikawa, Ogaki
(JP)

(73) Assignee: IBIDEN CO., LTD., Ogaki (JP)

( * ) Notice: Subject to any disclaimer, the term of this
patent is extended or adjusted under 35
U.S.C. 154(b) by 194 days.

(21) Appl. No.: 18/679,521

(22) Filed: May 31, 2024

(65) Prior Publication Data

US 2024/0407094 A1 Dec. 5, 2024

(30) Foreign Application Priority Data

Jun. 1, 2023 (JP) ................................. 2023-090824

(51) Int. Cl.
*H05K 1/11* (2006.01)
*H05K 1/03* (2006.01)
*H05K 3/10* (2006.01)
*H05K 3/16* (2006.01)
(52) U.S. Cl.
CPC .............. *H05K 1/115* (2013.01); *H05K 3/16*
(2013.01); *H05K 2201/0209* (2013.01); *H05K
2201/0245* (2013.01); *H05K 2201/09845*
(2013.01)
(58) Field of Classification Search
CPC ........... H05K 1/11; H05K 1/116; H05K 1/115
See application file for complete search history.

(56) References Cited

U.S. PATENT DOCUMENTS

| | | | | |
|---|---|---|---|---|
| 2022/0071016 | A1* | 3/2022 | Hwang | ................. H05K 3/427 |
| 2024/0145374 | A1* | 5/2024 | Nirengi | ............... H05K 3/4658 |
| 2024/0334601 | A1* | 10/2024 | Jeong | .................... H05K 1/115 |
| 2024/0339389 | A1* | 10/2024 | Kuramochi | ....... H01L 23/49894 |

FOREIGN PATENT DOCUMENTS

JP 2015-126103 A 7/2015

* cited by examiner

*Primary Examiner* — Timothy J Thompson
*Assistant Examiner* — Amol H Patel
(74) *Attorney, Agent, or Firm* — Finnegan, Henderson,
Farabow, Garrett & Dunner, LLP

(57) ABSTRACT

A printed wiring board includes a conductor layer including
wirings, a resin insulating layer having openings, a mount-
ing conductor layer including first and second electrodes,
first via conductors including a seed layer and an electrolytic
plating layer such that the first via conductors connect the
first electrodes and the wirings, and second via conductors
including the seed layer and electrolytic plating layer such
that the second via conductors connect the second electrodes
and the wirings. The first electrodes are positioned to mount
a first electronic component. The second electrodes are
positioned to mount a second electronic component. The
first and second via conductors are formed such that the seed
layer is covering an inner wall surface of each opening in the
insulating layer and has a first portion and a second portion
connected to the first portion and having a part of the first
portion formed on the second portion.

20 Claims, 12 Drawing Sheets

PRINTED WIRING BOARD

CROSS-REFERENCE TO RELATED APPLICATIONS

The present application is based upon and claims the benefit of priority to Japanese Patent Application No. 2023-090824, filed Jun. 1, 2023, the entire contents of which are incorporated herein by reference.

BACKGROUND OF THE INVENTION

Field of the Invention

The present invention relates to a printed wiring board.

Description of Background Art

Japanese Patent Application Laid-Open Publication No. 2015-126103 describes a printed wiring board having a first conductor layer, an insulating layer formed on the first conductor layer, and a second conductor layer formed on the insulating layer. The entire contents of this publication are incorporated herein by reference.

SUMMARY OF THE INVENTION

According to one aspect of the present invention, a printed wiring board includes a connection conductor layer including connection wirings, a resin insulating layer formed on the connection conductor layer and having openings, a mounting conductor layer formed on the resin insulating layer and including first electrodes and second electrodes, first connection via conductors formed in the resin insulating layer and including a seed layer and an electrolytic plating layer formed on the seed layer such that the first connection via conductors electrically connect the first electrodes and the connection wirings, and second connection via conductors formed in the resin insulating layer and including the seed layer and the electrolytic plating layer formed on the seed layer such that the second connection via conductors electrically connect the second electrodes and the connection wirings. The mounting conductor layer is formed such that the first electrodes are positioned to mount a first electronic component and that the second electrodes are positioned to mount a second electronic component, and the first and second connection via conductors are formed such that the seed layer is covering an inner wall surface of each of the openings in the resin insulating layer and has a first portion and a second portion connected to the first portion and having a part of the first portion formed on the second portion.

According to another aspect of the present invention, a method of manufacturing a printed wiring board includes forming a connection conductor layer including connection wirings, forming a resin insulating layer on the connection conductor layer such that the resin insulating layer has openings, forming a mounting conductor layer on the resin insulating layer such that the mounting conductor layer includes first electrodes and second electrodes, and forming connection via conductors including first connection via conductors and second connection via conductors in the resin insulating layer such that the first and second connection via conductors include a seed layer and an electrolytic plating layer formed on the seed layer, the first connection via conductors electrically connect the first electrodes and the connection wirings, and the second connection via conductors electrically connect the second electrodes and the connection wirings. The mounting conductor layer is formed such that the first electrodes are positioned to mount a first electronic component and that the second electrodes are positioned to mount a second electronic component, and the first and second connection via conductors are formed such that the seed layer is covering an inner wall surface of each of the openings in the resin insulating layer and has a first portion and a second portion connected to the first portion and having a part of the first portion formed on the second portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 is a cross-sectional view between II-II of FIG. 1;

FIG. 5 is a cross-sectional photograph schematically showing a part of a printed wiring board according to an embodiment of the present invention;

DETAILED DESCRIPTION OF THE EMBODIMENTS

Figure 1:
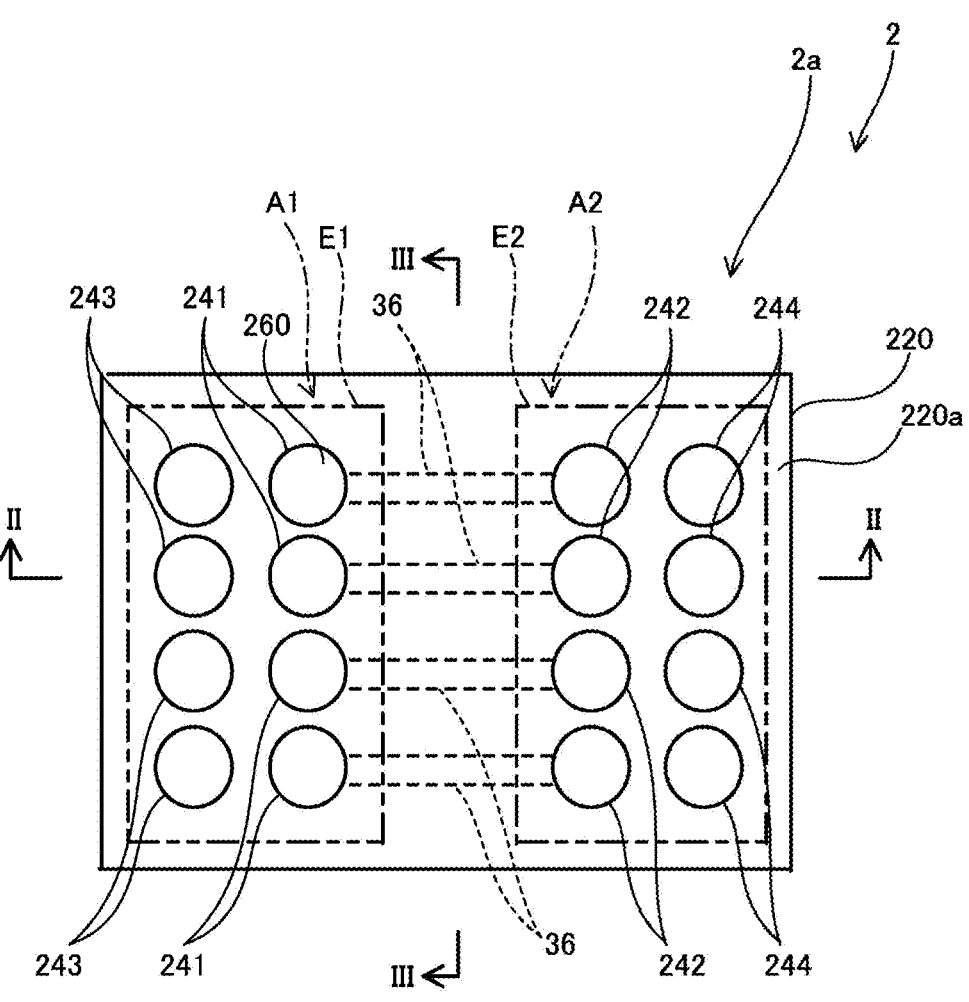
FIG. 1 is a plan view schematically illustrating a printed wiring board according to an embodiment of the present invention.

Embodiments will now be described with reference to the accompanying drawings, wherein like reference numerals designate corresponding or identical elements throughout the various drawings.

Figure 2:
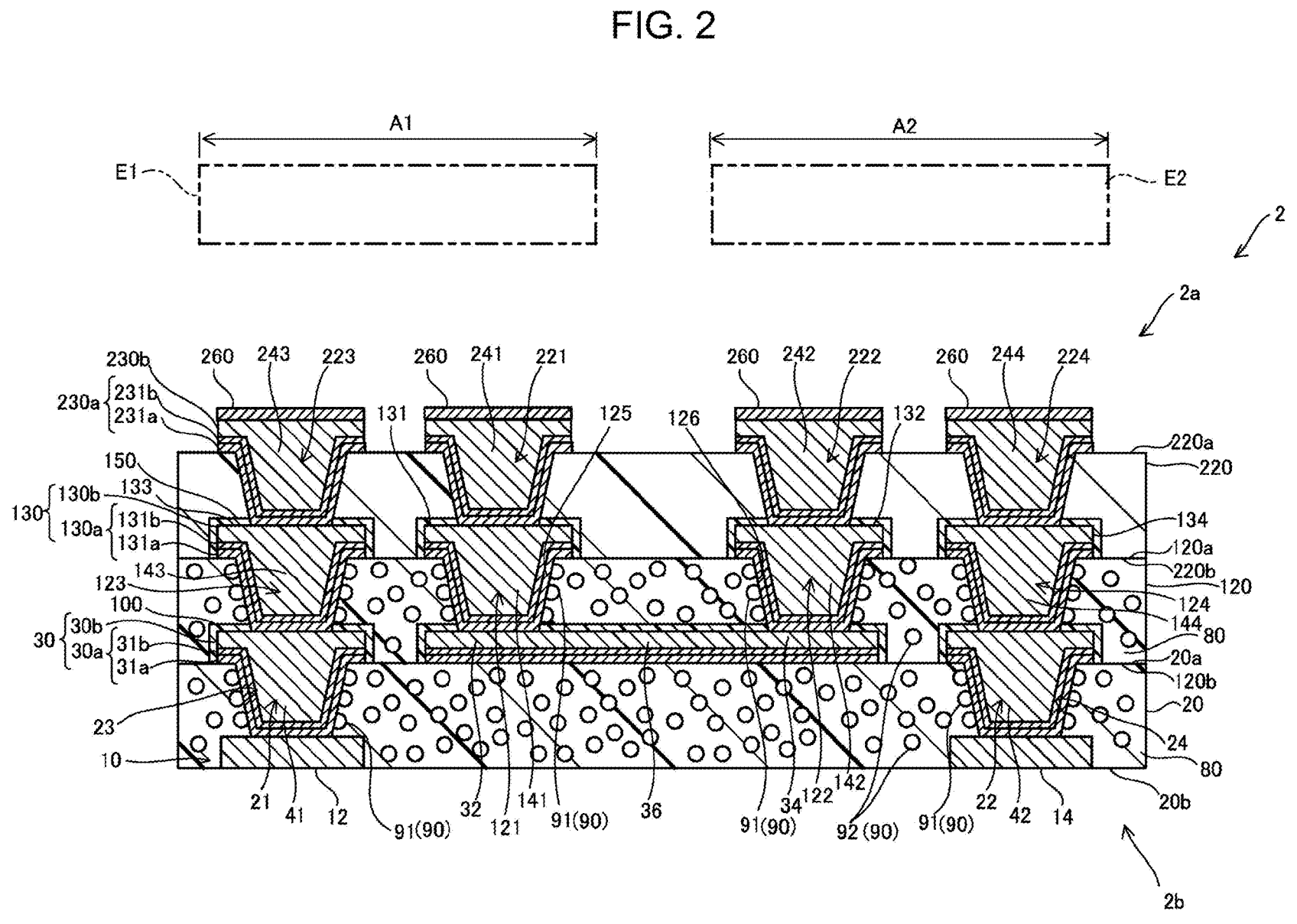
Figure 3:
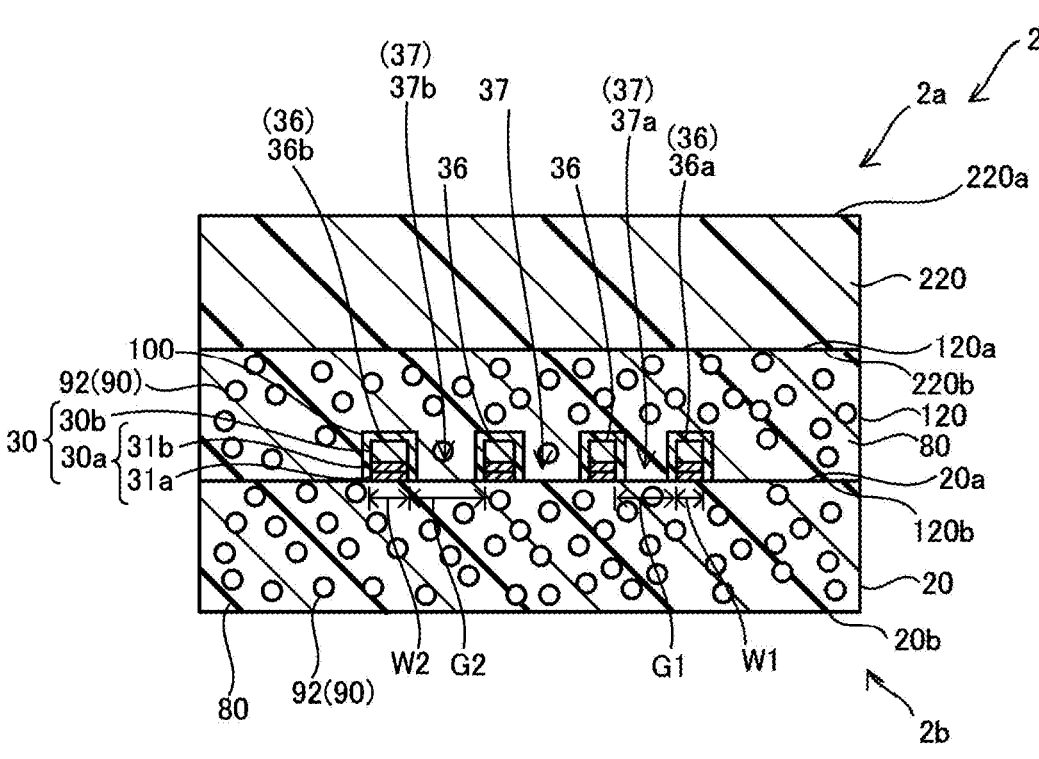
FIG. 3 is a cross-sectional view between III-III of FIG. 1.
Figure 4A:
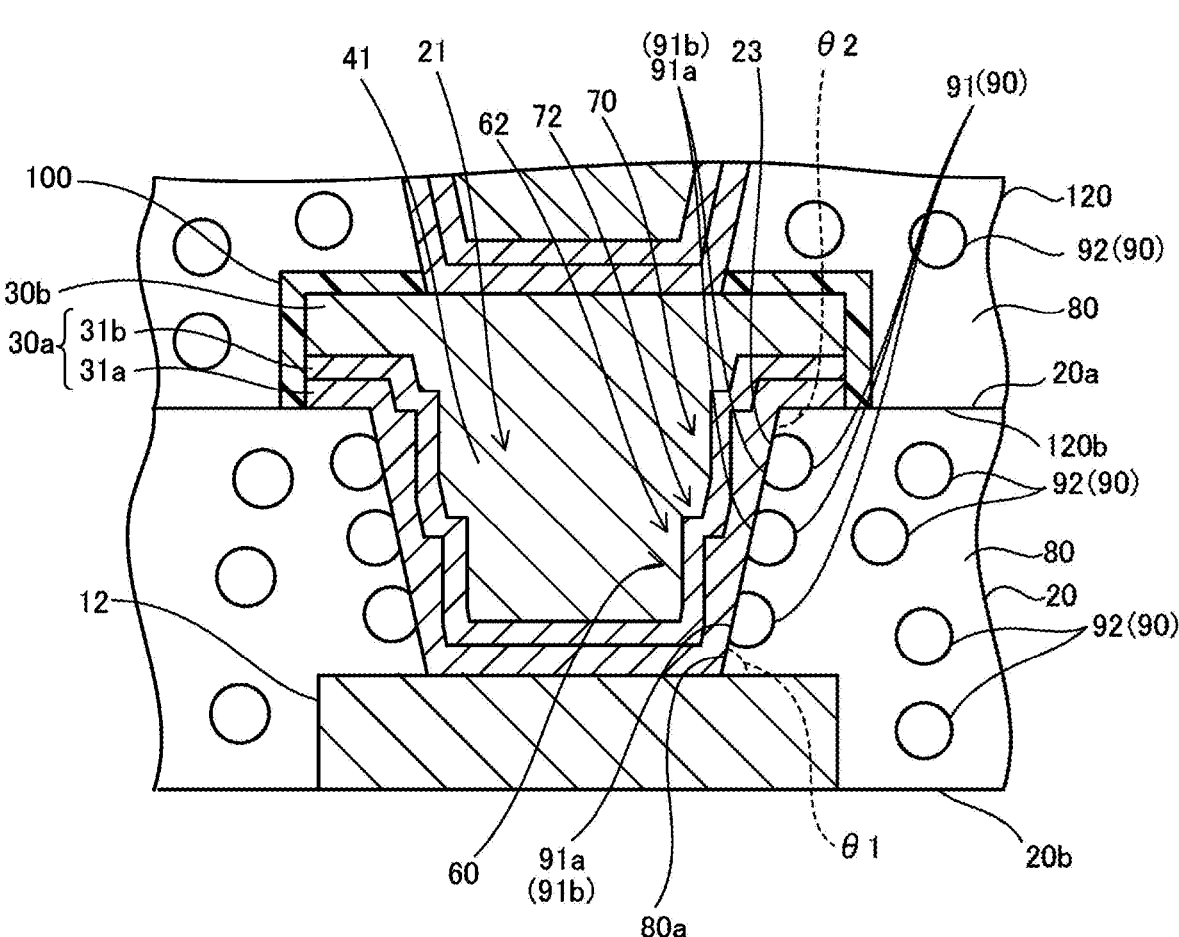
FIG. 4A is an enlarged cross-sectional view schematically illustrating a part of a printed wiring board according to an embodiment of the present invention.
Figure 6:
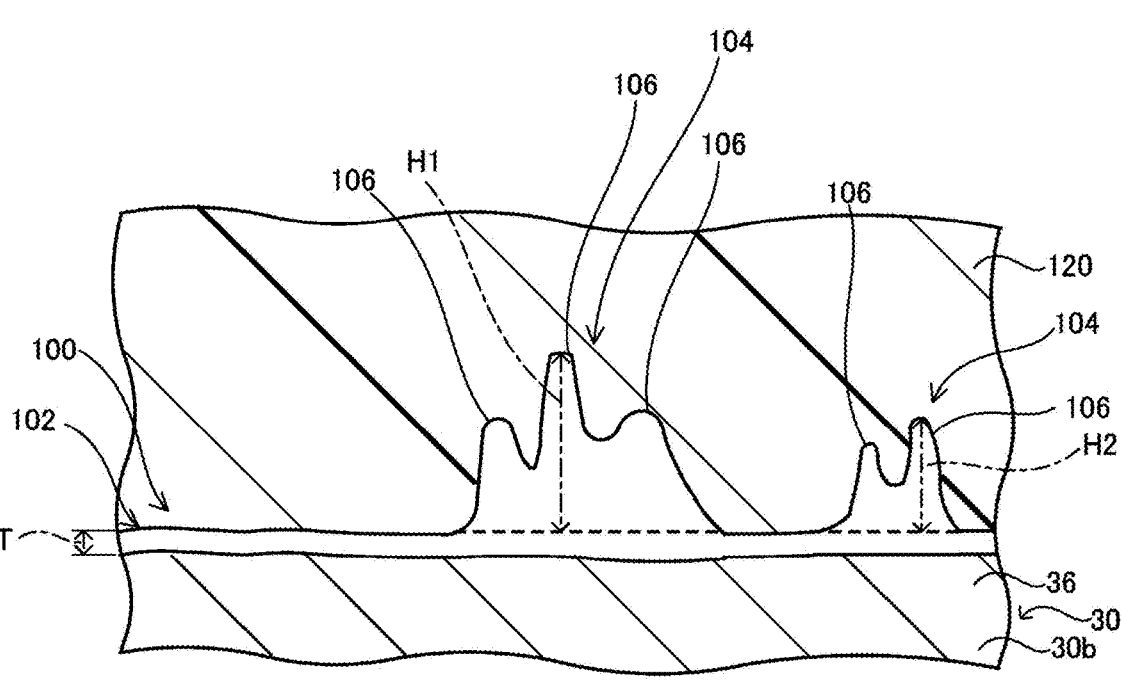
FIG. 6 is an enlarged cross-sectional view schematically illustrating a part of a printed wiring board according to an embodiment of the present invention.

FIG. 1 is a plan view illustrating a printed wiring board 2 according to an embodiment of the present invention. FIG. 2 is a cross-sectional view between II-II of FIG. 1. FIG. 3 is a cross-sectional view between III-III of FIG. 1. FIGS. 4A and 6 are each an enlarged cross-sectional view illustrating a part of the printed wiring board 2 of the embodiment. As illustrated in FIGS. 1 and 2, the printed wiring board 2 has an upper surface (2a) and a lower surface (2b) on the opposite side with respect to the upper surface (2a). The printed wiring board 2 has a first mounting region (A1) for mounting a first electronic component (E1) and a second mounting region (A2) for mounting a second electronic component (E2). The first mounting region (A1) is positioned directly below the first electronic component (E1). The second mounting region (A2) is positioned directly below the second electronic component (E2). Circles indicated with solid lines in FIG. 1 indicate bumps (metal posts) (241, 242, 243, 244) for mounting the electronic components. Wirings drawn with dotted lines indicate connection wirings 36 embedded in the printed wiring board 2. Examples of the first electronic component (E1) and the second electronic component (E2) are electronic components such as logic ICs and memories.

As illustrated in FIGS. 1-3, the printed wiring board 2 includes a conductor layer 10, a resin insulating layer (first resin insulating layer) 20, a connection conductor layer 30, via conductors (41, 42, 141, 142, 143, 144), a resin insulating layer (second resin insulating layer) 120, a mounting conductor layer 130, and bumps (241, 242, 243, 244). As illustrated in FIG. 2, the via conductors (41, 141, 143) are formed directly below the first mounting region (A1). The bumps (241, 243) are formed directly above the first mounting region (A1). The via conductors (42, 142, 144) are formed directly below the second mounting region (A2). The bumps (242, 244) are formed directly above the second mounting region (A2).

The connection conductor layer 30 includes the connection wirings 36. Data is transmitted from the first electronic component (E1) to the second electronic component (E2) via the connection wirings 36. The connection wirings 36 are each a part of a path for transmitting data from the first electronic component (E1) to the second electronic component (E2). The mounting conductor layer 130 includes electrodes (131, 132, 133, 134). The bumps 241, the electrodes 131, and the via conductors 141 are formed in a path (first path) between the first electronic component (E1) and the connection wirings 36. The first path is positioned directly below the first electronic component (E1). The bumps 242, the electrodes 132, and the via conductors 142 are formed in a path (second path) between the second electronic component (E2) and the connection wirings 36. The second path is positioned directly below the second electronic component (E2). The bumps 241, the electrodes

131, the via conductors 141, the bumps 242, the electrodes 132, and the via conductors 142 are also a part of a path. The bumps (241, 242) can be referred to as connection bumps (connection metal posts). The connection bumps 241 positioned directly below the first electronic component (E1) are first connection bumps (first connection metal posts), and the connection bumps 242 positioned directly below the second electronic component (E2) are second connection bumps (second connection metal posts). The electrodes (131, 132) can be referred to as connection electrodes. The connection electrodes 131 positioned directly below the first electronic component (E1) are first connection electrodes, and the connection electrodes 132 positioned directly below the second electronic component (E2) are second connection electrodes. The via conductors (141, 142) can be referred to as connection conductors. The connection via conductors 141 positioned directly below the first electronic component (E1) are first connection via conductors, and the connection via conductor 142 positioned directly below the second electronic component (E2) are second connection via conductors. The first connection bumps may also be referred to as first bumps (first metal posts). The first connection electrodes may also be referred to as first electrodes. The first connection via conductors may also be referred to as first via conductors. The second connection bumps may also be referred to as second bumps (second metal posts). The second connection electrodes may also be referred to as second electrodes. The second connection via conductors may also be referred to as second via conductors. The first bumps, the first electrodes, and the first via conductors, which are positioned directly below the first electronic component (E1) and electrically connected to the connection wirings 36, form the first path. The second bumps, the second electrodes, and the second via conductors, which are positioned directly below the second electronic component (E2) and electrically connected to the connection wirings 36, form the second path.

The via conductors (41, 42, 143, 144), the electrodes (133, 134) and the bumps (243, 244) do not form a path. These via conductors (41, 42, 143, 144), electrodes (133, 134) and bumps (243, 244) are electrically connected to power lines or ground lines in the electronic components. These via conductors (41, 42, 143, 144), electrodes (133, 134) and bumps (243, 244) are independent of the connection wirings 36. These via conductors (41, 42, 143, 144), electrodes (133, 134) and bumps (243, 244) are not electrically connected to the connection wirings 36.

As illustrated in FIG. 2, the conductor layer 10 includes pads (12, 14). The pads (12, 14) are exposed from the lower surface (2b) of the printed wiring board 2. The pads (12, 14) are used for connecting to another printed wiring board or electronic component. The conductor layer 10 is mainly formed of copper.

The resin insulating layer (first resin insulating layer) 20 is formed on the conductor layer 10. The resin insulating layer 20 has a first surface (20a) and a second surface (20b) on the opposite side with respect to the first surface (20a). The second surface (20b) of the resin insulating layer 20 forms the lower surface (2b) of the printed wiring board 2. The second surface (20b) of the resin insulating layer 20 faces the conductor layer 10. The resin insulating layer 20 has openings (via conductor openings) (21, 22) exposing the conductor layer 10. The openings 21 are positioned directly below the first mounting region (A1) and expose the pads 12. The openings 21 extend from the first surface (20a) of the resin insulating layer 20 to the pads 12. The openings 22 are positioned directly below the second mounting region (A2) and expose the pads 14. The openings 22 extend from the first surface (20a) of the resin insulating layer 20 to the pads 14. The resin insulating layer 20 is formed of a resin 80 and a large number of inorganic particles 90 dispersed in the resin 80. The resin 80 is an epoxy resin. Examples of the resin include a thermosetting resin and a photocurable resin. The inorganic particles 90 are glass particles. It is also possible that the inorganic particles 90 are alumina particles.

As illustrated in FIGS. 2 and 4A, the inorganic particles 90 include first inorganic particles 91 and second inorganic particles 92. The second inorganic particles 92 are embedded in a resin insulating layer (such as the first resin insulating layer 20 or the second resin insulating layer 120). The first Inorganic particles 91 form inner wall surfaces of the openings (via conductor openings). The second inorganic particles 92 each have a spherical shape. The first inorganic particles 91 each have a shape obtained by cutting a sphere along a flat surface. The first inorganic particles 91 each have a shape obtained by cutting a second inorganic particle 92 along a flat surface. The first inorganic particles 91 and the second inorganic particles 92 are different in shape.

The first surface (20a) of the resin insulating layer 20 is formed only of the resin 80. The inorganic particles 90 (second inorganic particles 92) are not exposed from the first surface (20a). The first surface (20a) does not include surfaces of the second inorganic particles 92. No unevenness is formed on the first surface (20a) of the resin insulating layer 20. The first surface (20a) is not roughened. The first surface (20a) is formed smooth.

Figure 5:
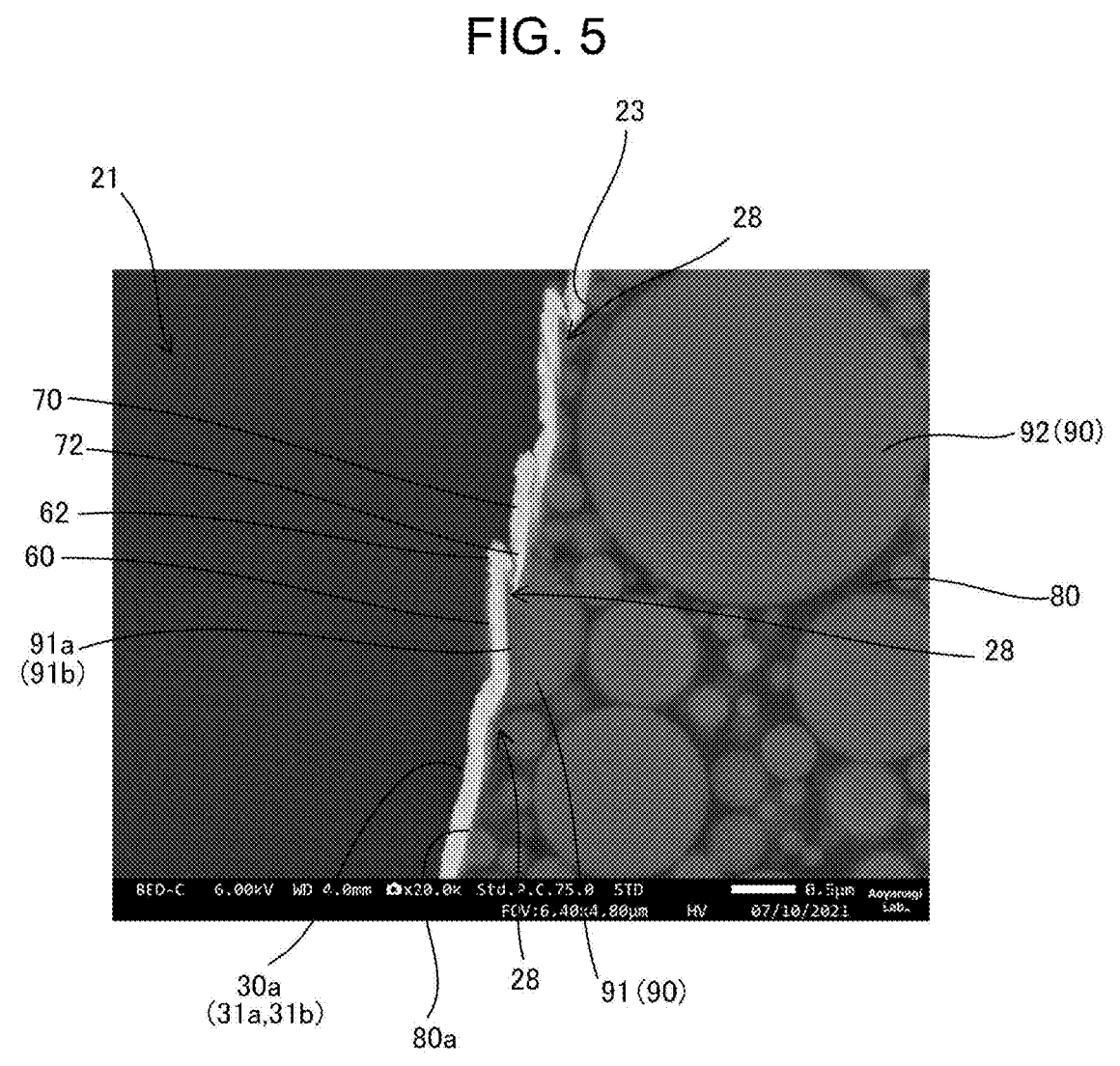

FIG. 5 is a cross-sectional photograph showing an example of an inner wall surface 23 of an opening (via conductor opening). As shown in FIGS. 4A and 5, the inner wall surface 23 of the opening (via conductor opening) is formed of the resin 80 and the first inorganic particles 91. In FIGS. 4A and 5, an opening 21 is shown as a representative example of the openings. The first inorganic particles 91 each have a flat part (91a). The flat parts (91a) form the inner wall surface 23. The inner wall surface 23 is formed of the resin 80 and the flat parts (91a). The flat parts (91a) and a surface of the resin 80 that forms the inner wall surface 23 form substantially a common surface. No unevenness is formed on the resin 80 that forms the inner wall surface 23. The surface of the resin 80 that forms the inner wall surface 23 is smooth. No unevenness is formed on exposed surfaces (91b) of the flat parts (91a) (surfaces that form the inner wall surface 23). The exposed surfaces (91b) of the flat parts (91a) are smooth. The inner wall surface 23 is formed smooth. The inner wall surface 23 has an arithmetic mean roughness (Ra) of 1.0 μm or less. As shown in FIG. 5, steps 28 are formed at boundary parts between the surface (80a) of the resin 80 and the flat parts (91a) of the first inorganic particles 91. Sizes of the steps 28 are preferably 3.0 μm or less, more preferably 1.5 μm or less, and even more preferably 0.5 μm or less. For example, distances between the exposed surfaces (91b) and the surface (80a) of the resin 80 indicate the sizes of the steps 28. Even when the inner wall surface 23 has the steps 28, since the sizes of the steps 28 are small, the exposed surfaces (91b) and the surface (80a) (the surface forming the inner wall surface 23) of the resin 80 form a substantially common surface.

The flat parts (91a) of the first inorganic particles 91 substantially coincide with a surface obtained by extending a surface (80a) of the resin 80 formed around the first inorganic particles 91 (a surface that forms the inner wall surface 23). The flat parts (91a) drawn with substantially straight lines in FIGS. 2 and 4A each mean a flat surface. In the cross sections illustrated in FIGS. 2 and 4A, the flat parts (91a) are each a flat surface. It is also possible that the flat parts (91a) are not each a perfect flat surface. The flat parts (91a) are each substantially a flat surface and are each substantially a smooth surface.

Figure 4B:
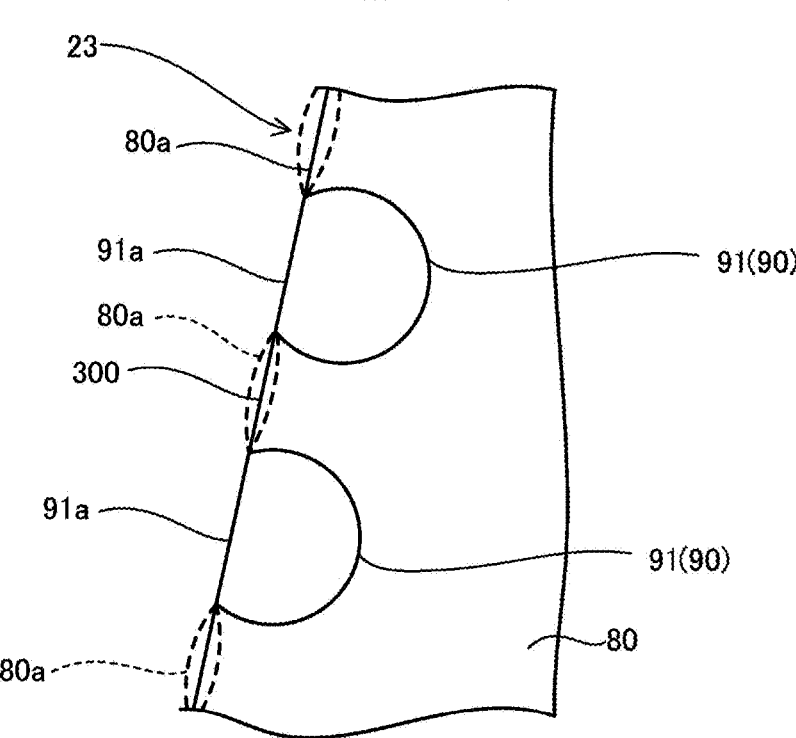
FIG. 4B is an enlarged cross-sectional view schematically illustrating a part of an inner wall surface in a printed wiring board according to an embodiment of the present invention.

FIG. 4B is an enlarged cross-sectional view illustrating a part of the inner wall surface 23 in FIG. 4A. As illustrated in FIG. 4B, with respect to a reference surface 300 connecting the flat parts (91a) of two first inorganic particles 91 forming the inner wall surface 23, the surface (80a) of the resin 80 positioned between the two first inorganic particles 91 may be concave or convex (see broken lines). Preferably, there are no other first inorganic particles 91 between the two first inorganic particles 91 that form the reference surface 300. A distance between the reference surface 300 and the surface (80a) of the resin 80 may be used as a representative value of the sizes of the steps 28.

As illustrated in FIG. 4A, the inner wall surface 23 of the opening 21 is inclined. An angle (inclination angle) (θ1) between an upper surface of the pad 12 and the inner wall surface 23 is 70 degrees or more and 85 degrees or less. The upper surface of the pad 12 is included in an upper surface of conductor layer 10. An angle (inclination angle) (θ2) between the first surface (20a) of the resin insulating layer 20 and the inner wall surface 23 is 95 degrees or more and 110 degrees or less.

In the cross-sections illustrated in FIGS. 2 and 4A, a via conductor opening such as the opening 21 is illustrated to have a substantially inverted trapezoidal shape. However, an actual via conductor opening has a substantially inverted truncated cone shape. Therefore, an inner wall surface (side wall) of an actual via conductor opening is a substantially curved surface. That is, a common surface formed by the flat parts (91a) and the resin 80 includes an inner wall surface (side wall) formed as a substantially curved surface.

The openings (21, 22) formed in the resin insulating layer 20 are similar. The openings (21, 22) formed in the resin insulating layer 20 have similar inner wall surfaces (23, 24). The inner wall surfaces (23, 24) of the openings (21, 22) are each formed of the surface (80a) of the resin 80 and the exposed surfaces (91b) of the first inorganic particles 91.

As illustrated in FIGS. 2 and 3, the connection conductor layer (first connection conductor layer) 30 is formed on the first surface (20a) of the resin insulating layer 20. As illustrated in FIG. 2, the connection conductor layer 30 includes pads (32, 34) and the connection wirings 36. The connection wirings 36 each have a one-end and an other-end on the opposite side with respect to the one-end. The pads 32 are first pads 32 and are respectively directly connected to the one-ends of the connection wirings 36. The pads 34 are second pads 34 and are respectively directly connected to the other-ends of the connection wirings 36. The first pads 32 are formed directly below the first mounting region (A1). The second pads 34 are formed directly below the second mounting region (A2). As illustrated in FIG. 3, the one connection conductor layer 30 includes the multiple connection wirings 36. Although not illustrated, the one connection conductor layer 30 includes the multiple first pads 32 and the multiple second pads 34. One first pad 32 and one second pad 34 are respectively connected to two ends of each of the connection wirings 36. The connection wirings 36 in the connection conductor layer 30 can include the first pads 32 and the second pads 34. The first pads 32 are included in the first path. The second pads 34 are included in the second path. Pads that are directly connected to the connection wirings 36 (such as the first pad 32 and the second pad 34) may be referred to as connection pads. The first pads 32 can be referred to as first connection pads. The second pads 34 can be referred to as second connection pads. The first pads 32, which are positioned directly below the first electronic component (E1) and are directly connected to the connection wirings 36, form the first path. The second pads 34, which are positioned directly below the second electronic component (E2) and are directly connected to the connection wirings 36, form the second path.

The connection wirings 36 are formed substantially parallel to each other. Among the multiple connection wirings 36, a connection wiring 36 having a smallest width (W1) is a smallest connection wiring (36a). The width (W1) of the smallest connection wiring (36a) is 1 μm or more and 3 μm or less. There are spaces 37 between adjacent connection wirings 36. Among the multiple spaces 37, a space 37 having a smallest width (G1) is a smallest space (37a). The width (G1) of the smallest space (37a) is 1 μm or more and 3 μm or less.

Among the multiple connection wirings 36, a connection wiring 36 having a largest width (W2) is a largest connection wiring (36b). The width (W2) of the largest connection wiring (36b) is 5 μm or less. The width (W2) of the largest connection wiring (36b) is preferably 3 μm or less. Among the multiple spaces 37, a space with a largest width (G2) is a largest space (37b). The width (G2) of the largest space (37b) is 5 μm or less. The width (G2) of the largest space (37b) is preferably 3 μm or less.

The connection wirings 36 preferably each have a width of 1 μm or more and 3 μm or less. The spaces 37 preferably each have a width of 1 μm or more and 3 μm or less.

The connection wirings 36 each have an aspect ratio (thickness/width). The aspect ratio is 2.0 or more and 4.0 or less.

The connection conductor layer 30 is mainly formed of copper. The connection conductor layer 30 is formed of a seed layer (30a) on the first surface (20a) of the resin insulating layer 20 and an electrolytic plating layer (30b) on the seed layer (30a). The seed layer (30a) is formed by sputtering. The seed layer (30a) is formed of a first layer (31a) on the first surface (20a) of the resin insulating layer 20 and a second layer (31b) on the first layer (31a). The first layer (31a) is in contact with the first surface (20a) of the resin insulating layer 20. For example, the first layer (31a) of the seed layer (30a) is formed of a copper alloy, and the second layer (31b) is formed of copper. The second layer (31b) may not be essential.

The first layer (31a) is formed of an alloy containing copper, aluminum, and a specific metal. Examples of the specific metal include nickel, zinc, gallium, silicon, and magnesium. The alloy preferably contains one type of specific metal, or two types of specific metals, or three types of specific metals. A content of aluminum in the alloy is 1.0 at % or more and 15.0 at % or less. An example of the specific metal is silicon. A content of the specific metal in the alloy is 0.5 at % or more and 10.0 at % or less. The first layer (31a) may contain impurities. Examples of the impurities include oxygen and carbon. The first layer (31a) can contain oxygen or carbon. The first layer (31a) can contain oxygen and carbon. In the embodiment, the alloy further contains carbon. A content of carbon in the alloy is 50 ppm or less. The alloy further contains oxygen. A content of oxygen in the alloy is 100 ppm or less. The values of the contents of the elements described above are examples. Among the elements forming the first layer (31a), copper has the largest content. The content of aluminum is the next largest. The content of the specific metal is less than the content of aluminum. Therefore, copper is a primary metal, aluminum is a first secondary metal, and the specific metal is a second secondary metal. A content of the impurities is smaller than the content of the specific metal.

The second layer (31b) is formed of copper. A content of copper forming the second layer (31b) is 99.9 at % or more. The content of copper in the second layer (31b) is preferably 99.95 at % or more. The electrolytic plating layer (30b) is formed of copper. A content of copper forming the electrolytic plating layer (30b) is 99.9 at % or more. The content of copper in the electrolytic plating layer (30b) is preferably 99.95 at % or more.

In the embodiment, an adhesive layer 100 can be formed on a surface (including upper and side surfaces) of the connection conductor layer 30. The adhesive layer 100 may not be essential. The surface of the connection conductor layer 30 is formed of a first surface and a second surface. Of the surface, the first surface is a portion that is exposed by the via conductor openings. The second surface is a portion other than the first surface. The first surface is not covered by the adhesive layer 100, and the second surface is covered by the adhesive layer 100. The adhesive layer 100 is in contact with the connection conductor layer 30. The adhesive layer 100 is in contact with the second surface of the connection conductor layer 30. The adhesive layer 100 is formed of resin. The adhesive layer 100 is formed of an organic material (organic resin). An example of the organic material is a nitrogen-based organic compound. The nitrogen-based organic compound is, for example, a tetrazole compound. Examples of the nitrogen-based organic compound are disclosed in Japanese Patent Application Laid-Open Publication No. 2015-54987. The adhesive layer 100 does not cover the first surface (20a) of the resin insulating layer 20 exposed from the connection conductor layer 30. The adhesive layer 100 is formed between the connection conductor layer 30 and the second resin insulating layer 120. The adhesive layer 100 is sandwiched between the connection conductor layer 30 and the resin insulating layer (second resin insulating layer) 120. The adhesive layer 100 adheres the connection conductor layer 30 and the resin insulating layer 120. The connection wirings 36 can have only the second surface.

FIG. 6 is an enlarged cross-sectional view illustrating a part of the adhesive layer 100 formed on the second surface of the connection wirings 36. As illustrated in FIG. 6, the adhesive layer 100 is formed of a smooth film 102, which is substantially smooth, and multiple protruding parts 104 protruding from the smooth film 102. The adhesive layer 100 formed on the second surface of the pads (such as the pads (32, 34)) is formed of a smooth film 102 and multiple protruding parts 104 similar to that in FIG. 6, and also has a similar shape.

The smooth film 102 has a substantially uniform thickness (T). The thickness (T) of the smooth film 102 is 10 nm or more and 120 nm or less. A ratio (S1/S2) of an area (S1) of the smooth film 102 exposed from the protruding parts 104 to an area (S2) of the adhesive layer 100 is 0.1 or more and 0.5 or less. The smooth film 102 on the second surface of the connection conductor layer 30 is formed substantially along a shape of the second surface of the connection conductor layer 30. When undulations are formed on the upper surface and the side surface of the connection conductor layer 30, the smooth film 102 follows the undulations.

The protruding parts 104 are each formed of multiple protrusions 106. Due to the multiple protrusions 106, unevenness is formed on upper surfaces of the protruding parts 104. The number of the protrusions 106 per 1 mm2 is 5 or more and 15 or less. The protruding parts 104 have heights (H1, H2) between the upper surface of the smooth film 102 and top parts of the protruding parts 104. A maximum value of the heights (H1, H2) is 10 times or more and 30 times or less the thickness (T) of the smooth film 102. The heights (H1, H2) are 200 nm or more and 450 nm or less.

As illustrated in FIG. 2, the via conductors (41, 42) are formed in the openings (via conductor openings (21, 22)). The via conductors (41, 42) electrically connect the conductor layer 10 and the connection conductor layer 30. The via conductors (41, 42) and the connection conductor layer 30 are formed at the same time. The via conductors (41, 42) are formed of a seed layer (30a) and an electrolytic plating layer (30b) on the seed layer (30a). The seed layer (30a) forming the via conductors (41, 42) and the seed layer (30a) forming the connection conductor layer 30 are common. The electrolytic plating layer (30b) forming the via conductors (41, 42) and the electrolytic plating layer (30b) forming the connection conductor layer 30 are common. The seed layer (30a) forming the via conductors (41, 42) is formed of a first layer (31a), which is formed on the inner wall surfaces (23, 24) of the via conductor openings (21, 22) and on the pads (12, 14) exposed from the via conductor openings (21, 22), and a second layer (31b) on the first layer (31a). The first layer (31a) is in contact with the pads (12, 14) and the inner wall surfaces (23, 24). The resin insulating layer (first resin insulating layer) 20 supports the connection conductor layer (first connection conductor layer) 30. The connection conductor layer (first connection conductor layer) 30, which is contact with the first surface (20a) of the resin insulating layer (first resin insulating layer) 20, and the via conductors (41, 42), which penetrate the resin insulating layer (first resin insulating layer) 20, are formed at the same time. In the embodiment, the seed layer (30a) forming the via conductors (41, 42) can be reduced in thickness. In the embodiment, the first layer (31a) forming the via conductors (41, 42) can be reduced in thickness. In the embodiment, the second layer (31b) forming the via conductors (41, 42) can be reduced in thickness. Therefore, in the embodiment, a connection conductor layer 30 having fine connection wirings 36 can be formed.

Figure 4C:
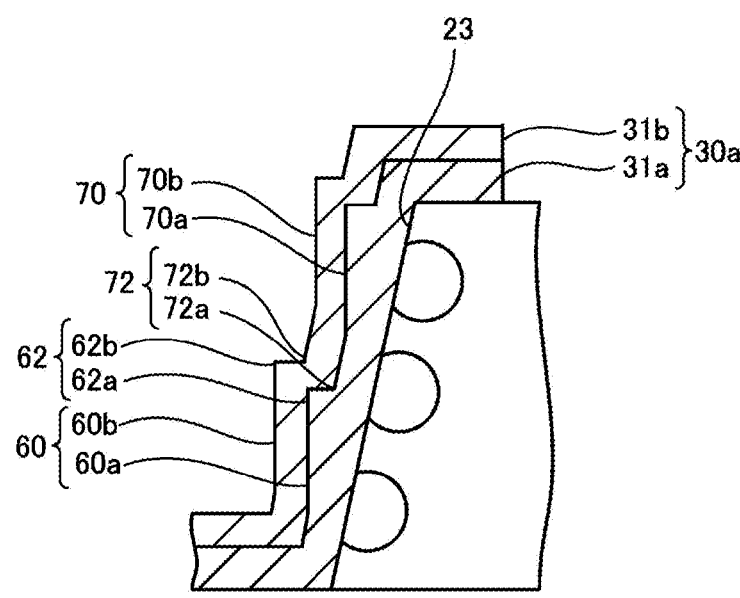
FIG. 4C is an enlarged cross-sectional view schematically illustrating a part of a seed layer in a printed wiring board according to an embodiment of the present invention.

FIG. 4C is an enlarged cross-sectional view schematically illustrating a part of the seed layer (30a) on the inner wall surface 23 of FIG. 4A. FIG. 5 shows an example of the seed layer (30a). The seed layer (30a) on the inner wall surface 23 is in contact with the inner wall surface 23. As shown in FIGS. 4A, 4C and 5, the seed layer (30a) forming the via conductors 41 has a substantially smooth first portion (first film) 60 and a substantially smooth second portion (second film) 70. The first portion 60 and the second portion 70 are electrically connected. The first portion 60 and second portion 70 are continuous. As shown in FIG. 5, a part of the first portion 60 is formed on the second portion 70. A leading end 62 of the first portion 60 is formed on a trailing end 72 of the second portion 70. The first portion 60 and the second portion 70 are formed at the same time. The seed layer (30a) covering the inner wall surface 23 has a substantially step-shaped cross section.

As illustrated in FIG. 4C, the first layer (31a) of the seed layer (30a) has a first portion (first film) (60a) and a second portion (second film) (70a). The first portion (60a) and the second portion (70a) are electrically connected. The first portion (60a) and the second portion (70a) are continuous. A leading end (62a) of the first portion (60a) is formed on a trailing end (72a) of the second portion (70a). The first layer (31a) covering the inner wall surface 23 has a substantially step-shaped cross section. The first layer (31a) on the inner wall surface 23 is in contact with the inner wall surface 23.

The second layer (31b) of the seed layer (30a) has a first portion (first film) (60b) and a second portion (second film) (70b). The first portion (60b) and the second portion (70b) are electrically connected. A leading end (62b) of the first portion (60b) is formed on a trailing end (72b) of the second portion (70b). The second layer (31b) formed on the inner wall surface 23 has a substantially step-shaped cross section.

In the embodiment, a part of the first portion 60 is laminated on the second portion 70. A part of the first portion 60 overlaps the second portion 70. The leading end 62 of the first portion 60 is laminated on the trailing end 72 of the second portion 70. The leading end 62 of the first portion 60 overlaps the trailing end 72 of the second portion 70.

The inner wall surface 23 of the embodiment is formed as a substantially smooth surface. When the first layer (31a) follows the shape of the inner wall surface 23, the first layer (31a) on the inner wall surface 23 has a substantially smooth surface. The first layer (31a) has a linear cross-sectional shape. The seed layer (30a) on the inner wall surface 23 has a substantially smooth surface. The seed layer (30a) has a linear cross-sectional shape. In this case, the electrolytic plating layer (30b) forming the via conductors 41 is formed on a smooth surface. For example, when the printed wiring board 2 is subjected to a large impact, peeling occurs between the first layer (31a) on the inner wall surface 23 and the second layer (31b) on the first layer (31a). Or, peeling occurs between the seed layer (30a) on the inner wall surface 23 and the electrolytic plating layer (30b) forming the via conductors 41. In contrast, the seed layer (30a) and the first layer (31a) of the embodiment each have a step-shaped cross section. Therefore, peeling is unlikely to occur.

The resin insulating layer (second resin insulating layer) 120, which has a first surface (120a) and a second surface (120b) on the opposite side with respect to the first surface (120a), is formed on the connection conductor layer 30 and the resin insulating layer 20 via the adhesive layer 100. The resin insulating layer 120 is adhered to the connection conductor layer 30 by the adhesive layer 100. The resin insulating layer 120 is in contact with the adhesive layer 100. The second surface (120b) of the resin insulating layer 120 faces the connection conductor layer 30. Similar to the resin insulating layer 20, the resin insulating layer 120 is formed of a resin 80 and inorganic particles 90 (first inorganic particles 91 and second inorganic particles 92). Therefore, a material of the resin insulating layer (second resin insulating layer) 120 and a material of the resin insulating layer (first resin insulating layer) 20 are similar. The first surface (120a) of the resin insulating layer 120 is similar to the first surface (20a) of the resin insulating layer 20.

The resin insulating layer 120 has openings (via conductor openings) (121, 122, 123, 124). The openings 121 are first openings 121 exposing the first pads 32. The openings 122 are second openings 122 exposing the second pads 34. The first openings 121 and the openings 123 are formed directly below the first mounting region (A1). The second openings 122 and the openings 124 are formed directly below the second mounting region (A2). The first openings 121 and the second openings 122 extend to the pads (32, 34), which are directly connected to the connection wirings 36. Such openings (the first openings 121, the second openings 122, and the like) may be referred to as connection via conductor openings. The first openings 121 positioned directly below the first electronic component (E1) are first connection via conductor openings, and the second openings 122 positioned directly below the second electronic component (E2) are second connection via conductor openings. The first openings 121, the second openings 122, and the openings (123, 124) are similar to the opening 21 illustrated in FIG. 4A. Therefore, an inner wall surface 125 of each of the first openings 121, an inner wall surface 126 of each of the second openings 122, and an inner wall surface of each of the openings (123, 124) are similar to the inner wall surface 23 of the opening 21 illustrated in FIG. 4A. An inner wall surface of a via conductor opening penetrating the resin insulating layer (second resin insulating layer) 120 is similar to an inner wall surface of a via conductor opening penetrating the resin insulating layer (first resin insulating layer) 20. The via conductor openings penetrating the resin insulating layers have substantially similar inner wall surfaces.

The mounting conductor layer 130 is formed on the first surface (120a) of the resin insulating layer 120. The resin insulating layer 120 supporting the mounting conductor layer 130 is an uppermost resin insulating layer. The mounting conductor layer 130 is in contact with the first surface of the uppermost resin insulating layer. The mounting conductor layer 130 includes the multiple first electrodes 131 and the multiple second electrodes 132. The mounting conductor layer 130 includes the electrodes (133, 134) in addition to the first electrode 131 and the second electrode 132. The first electrode 131 and the electrode 133 are formed in the first mounting region (A1). The first electronic component (E1) is mounted on the printed wiring board 2 via the first electrodes 131 and the electrodes 133. The second electrodes 132 and the electrodes 134 are formed in the second mounting region (A2). The second electronic component (E2) is mounted on the printed wiring board 2 via the second electrodes 132 and the electrodes 134. The mounting conductor layer 130 may further include multiple connection wirings (second connection wirings). In this case, the second connection wirings each have a one-end and an other-end on the opposite side with respect to the one-end. The one-end of each of the second connection wirings is directly connected to one of the first electrodes 131. The other-end of each of the second connection wirings is directly connected to one of the second electrodes 132. The second connection wirings electrically connect the first electrodes 131 and the second electrodes 132. Data is transmitted from the first electronic component (E1) to the second electronic component (E2) via the second connection wirings. The connection wirings in the mounting conductor layer 130 may not be essential. The connection wirings in the mounting conductor layer 130 can include the first electrodes 131 and the second electrodes 132.

The mounting conductor layer 130 and the connection conductor layer 30 are similar. Therefore, the mounting conductor layer 130 is formed of a seed layer (130a) and an electrolytic plating layer (130b) on the seed layer (130a). The seed layer (130a) is formed of a first layer (131a) and a second layer (131b) on the first layer (131a). The seed layer (130a) forming the mounting conductor layer 130 and the seed layer (30a) forming the connection conductor layer 30 are similar. The first layer (131a) forming the mounting conductor layer 130 and the first layer (31a) forming the connection conductor layer 30 are similar. The second layer (131b) forming the mounting conductor layer 130 and the second layer (31b) forming the connection conductor layer 30 are similar. The electrolytic plating layer (130b) forming the mounting conductor layer 130 and the electrolytic plating layer (30b) forming the connection conductor layer 30 are similar.

When the mounting conductor layer 130 includes the connection wirings, the connection wirings in the mounting conductor layer 130 and the connection wirings 36 in the connection conductor layer 30 are similar. Therefore, the widths (W1, G1, W2, G2) of the connection wirings in the mounting conductor layer 130 are respectively similar to the widths (W1, G1, W2, G2) of the connection wirings 36 in the connection conductor layer 30. The connection wirings in the mounting conductor layer 130 each have an aspect ratio (thickness/width) of 2.0 or more and 4.0 or less.

An adhesive layer 150 can be formed on a surface (including upper and side surfaces) of the mounting conductor layer 130. The adhesive layer 150 may not be essential. The surface of the mounting conductor layer 130 is formed of a third surface and a fourth surface. Of the surface, the third surface is a portion that is exposed by openings. An example of the openings is bump formation openings. The fourth surface is a portion other than the third surface. The third surface is not covered by the adhesive layer 150, and the fourth surface is covered by the adhesive layer 150. The adhesive layer 150 covering the fourth surface of the mounting conductor layer 130 is similar to the adhesive layer 100 covering the second surface of the connection conductor layer 30. Therefore, the adhesive layer 150 is formed of a smooth film 102, which is substantially smooth, and protruding parts 104 protruding from the smooth film 102 (see FIG. 6). The adhesive layer 150 does not cover the first surface (120a) of the resin insulating layer 120 exposed from the mounting conductor layer 130. The adhesive layer 150 adheres the mounting conductor layer 130 and an insulating layer 220. When the mounting conductor layer 130 includes the connection wirings, the connection wirings can have only the fourth surface.

The via conductors (141, 142, 143, 144) are respectively formed in the openings (via conductor openings) (121, 122, 123, 124) that penetrate the resin insulating layer 120. The via conductors 141 formed in the first openings 121 are the first connection via conductors 141. The first connection via conductors 141 connect to the first pads 32 extending from the one-ends of the connection wirings 36. The via conductors 142 formed in the second openings 122 are the second connection via conductors 142. The second connection via conductors 142 connect to the second pads 34 extending from the other-ends of the connection wirings 36. The first connection via conductors 141 and the second connection via conductor 142 electrically connect the connection conductor layer 30 and the mounting conductor layer 130. The first connection via conductors 141 electrically connect the first pads 32 and the first electrodes 131. The second connection via conductors 142 electrically connect the second pads 34 and the second electrodes 132. The first connection via conductors 141 electrically connect the first electrodes 131 and the connection wirings 36. The second connection via conductors 142 electrically connect the second electrodes 132 and the connection wirings 36. The inner wall surfaces (125, 126) of the openings (121, 122) for the connection via conductors (141, 142) are each formed of the exposed surfaces (91b) of the first inorganic particles 91 and the surface (80a) of the resin 80. The exposed surfaces (91b) of the first inorganic particles 91 and the surface (80a) of the resin 80 form a substantially common surface. The inner wall surface of each of the connection via conductor openings is substantially flat. Therefore, when data from the first electrodes 131 to the second electrodes 132 passes through the connection via conductors (141, 142), the data is unlikely to degrade. The connection via conductors of the embodiment are suitable as via conductors for transmitting high-speed data. The printed wiring board 2 of the embodiment can transmit a large amount of data via the connection via conductors.

The connection via conductors are each formed of a seed layer (130a) and an electrolytic plating layer (130b) on the seed layer (130a). The first connection via conductors 141 and the second connection via conductors 142 are examples of the connection via conductors. The seed layer (130a) forming the connection via conductors (141, 142) and the seed layer (130a) forming the mounting conductor layer 130 are common. The first layer (131a) forming the connection via conductors (141, 142) and the first layer (131a) forming the mounting conductor layer 130 are common. The second layer (131b) forming the connection via conductors (141, 142) and the second layer (131b) forming the mounting conductor layer 130 are common. The electrolytic plating layer (130b) forming the connection via conductors (141, 142) and the electrolytic plating layer (130b) forming the mounting conductor layer 130 are common. The seed layer (130a) forming the connection via conductors (141, 142) is formed of a first layer (131a), which is formed on the inner wall surfaces (125, 126) of the connection via conductor openings (121, 122) and on the pads (32, 34) exposed from the connection via conductor openings (121, 122), and a second layer (131b) on the first layer (131a). The first layer (131a) is in contact with the inner wall surfaces (125, 126) and the pads (32, 34). The via conductors (143, 144) are formed in the openings (123, 124) other than the connection via conductor openings (121, 122).

The seed layer (130a) forming the connection via conductors (141, 142) and the seed layer (30a) forming the via conductors (41, 42) are similar. The first layer (131a) forming the connection via conductors (141, 142) and the first layer (31a) forming the via conductors (41, 42) are similar. The second layer (131b) forming the connection via conductors (141, 142) and the second layer (31b) forming the via conductors (41, 42) are similar. The electrolytic plating layer (130b) forming the connection via conductors (141, 142) and the electrolytic plating layer (30b) forming the via conductors (41, 42) are similar.

The seed layer (130a) forming the connection via conductors (141, 142) has a first portion (first film) 60 and a second portion (second film) 70 similar to the seed layer (30a) forming the via conductors (41, 42) (FIGS. 4A, 4C, and 5). The first portion 60 and the second portion 70 are electrically connected. The first portion 60 and second portion 70 are continuous. A part of the first portion 60 is formed on the second portion 70 (FIG. 5). A leading end 62 of the first portion 60 is formed on a trailing end 72 of the second portion 70. The first portion 60 and the second portion 70 are formed at the same time. The seed layer (30a) covering the inner wall surfaces (125, 126) has a substantially step-shaped cross section.

The first layer (131a) of the seed layer (130a) has a first portion (first film) (60a) and a second portion (second film) (67a). The first portion (60a) and the second portion (70a) are electrically connected. The first portion (60a) and the second portion (70a) are continuous. A leading end (62a) of the first portion (60a) is formed on a trailing end (72a) of the second portion (67a). The first layer (131a) covering the inner wall surfaces (125, 126) has a substantially step-shaped cross section. The first layer (131a) on the inner wall surfaces (125, 126) is in contact with the inner wall surfaces (125, 126).

The second layer (131b) of the seed layer (130a) has a first portion (first film) (60b) and a second portion (second film) (70b). The first portion (60b) and the second portion (70b) are electrically connected. The first portion (60b) and the second portion (70b) are continuous. A leading end (62b) of the first portion (60b) is formed on a trailing end (72b) of the second portion (70b). The second layer (131b) formed on the inner wall surfaces (125, 126) has a substantially step-shaped cross section.

The inner wall surfaces (125, 126) of the embodiment are formed as substantially smooth surfaces. The seed layer (130a) and the first layer (131a) of the embodiment each have a step-shaped cross section. Therefore, peeling is unlikely to occur between the first layer (131a) and the second layer (131b). Peeling is unlikely to occur between the second layer (131b) and the electrolytic plating layer (130b).

The mounting conductor layer is formed directly on the resin insulating layer (mounting resin insulating layer) that supports the mounting conductor layer. The mounting conductor layer is in contact with the mounting resin insulating layer. The seed layer forming the mounting conductor layer and the seed layer forming the via conductors penetrating the mounting resin insulating layer are common. The two are formed at the same time. The first layer forming the mounting conductor layer and the first layer forming the via conductors penetrating the mounting resin insulating layer are common. The two are formed at the same time. The second layer forming the mounting conductor layer and the second layer forming the via conductors penetrating the mounting resin insulating layer are common. The two are formed at the same time. The first layer and the second layer form the seed layer. The electrolytic plating layer forming the mounting conductor layer and the electrolytic plating layer forming the via conductors penetrating the mounting resin insulating layer are common. The two are formed at the same time. The inner wall surface of each of the via conductor openings penetrating the mounting resin insulating layer and the inner wall surface 23 of the opening 21 illustrated in FIG. 4A are similar. Therefore, the seed layer forming the mounting conductor layer can be reduced in thickness. The mounting conductor layer can have fine connection wirings.

The insulating layer 220, which has a first surface (220a) and a second surface (220b) on the opposite side with respect to the first surface (220a), is formed on the mounting conductor layer 130 and on the first surface (120a) of the resin insulating layer 120. The adhesive layer 150 can be formed on the mounting conductor layer 130. In this case, the insulating layer 220 is formed on the mounting conductor layer 130 via the adhesive layer 150. The adhesive layer 150 formed on the mounting conductor layer 130 and the adhesive layer 100 formed on the connection conductor layer 30 are similar. The insulating layer 220 is adhered to the mounting conductor layer 130 by the adhesive layer 150. The second surface (220b) of the insulating layer 220 faces the mounting conductor layer 130. The insulating layer 220 functions as a solder resist layer. A material of the insulating layer 220 is preferably different from the material of the resin insulating layers (20, 120). The insulating layer 220 is formed, for example, using an epoxy resin or polyimide resin containing a photosensitizer.

The insulating layer 220 has openings (bump openings) (221, 222, 223, 224) that expose the electrodes (131, 132, 133, 134). The openings 221 are first openings (first bump openings) 221 that expose the first electrodes 131. The openings 222 are second openings (second bump openings) 222 that expose the second electrodes 132. The first openings 221 and the openings 223 are formed directly above the first mounting region (A1). The second openings 222 and the openings 224 are formed directly above the second mounting region (A2).

The bumps (241, 242, 243, 244) are formed on the electrodes (131, 132, 133, 134) exposed from the openings (bump openings) (221, 222, 223, 224). The bumps 241 formed on the first electrodes 131 exposed from the first openings (first bump openings) 221 are first bumps 241. The bumps 242 formed on the second electrodes 132 exposed from the second openings (second bump openings) 222 are second bumps 242. The bumps (241, 242, 243, 244) are examples of bumps for mounting electronic components (such as the first electronic component (E1) and the second electronic component (E2)) on the printed wiring board 2. The first bumps 241 and the bumps 243 are positioned in the first mounting region (A1), and the first electronic component (E1) is mounted on the printed wiring board 2 via these bumps (241, 243). The second bumps 242 and the bumps 244 are positioned in the second mounting region (A2), and the second electronic component (E2) is mounted on the printed wiring board 2 via these bumps (242, 244).

The bumps (241, 242, 243, 244) are formed of a portion (first portion) that fills the openings (221, 222, 223, 224) and a second portion (land) on the first portion. The second portion is formed directly on the first portion and on the first surface (220a) of the insulating layer 220 around the openings (221, 222, 223, 224). The second portion protrudes from the first surface (220a) of the insulating layer 220. The first bumps 241 electrically connect the first electronic component (E1) and the first electrodes 131. The second bumps 242 electrically connect the second electronic component (E2) and the second electrodes 132. The first electronic component (E1) and the second electronic component (E2) are connected via the first bumps 241, the first connection via conductors 141, the connection wirings 36, the second connection via conductors 142, and the second bumps 242. When data is transmitted from the first electronic component (E1) to the second electronic component (E2), the data is transmitted via a path that includes the connection via conductors and the connection wirings. Since the connection via conductors and the connection wirings include a sputtered seed layer that is formed on a substantially flat surface, the printed wiring board 2 of the embodiment can transmit a large amount of data at a high speed from the first electronic component (E1) to the second electronic component (E2). When data is transmitted, data degradation is unlikely to occur.

The bumps (241, 242, 243, 244) are formed of a seed layer (230a) and an electrolytic plating layer (230b) on the seed layer (230a). The seed layer (230a) is formed of a first layer (231a) and a second layer (231b) on the first layer (231a). The seed layer (230a) forming the bumps (such as the first bumps 241 and the second bumps 242) and the seed layer (30a) forming the connection conductor layer 30 are similar. The first layer (231a) forming the bumps and the first layer (31a) forming the connection conductor layer 30 are similar. The second layer (231b) forming the bumps and the second layer (31b) forming the connection conductor layer 30 are similar. The electrolytic plating layer (230b) forming the bumps and the electrolytic plating layer (30b) forming the connection conductor layer 30 are similar. In a modified example, the bumps (241, 242, 243, 244) may be formed of solder.

A functional layer 260 is formed on tops of the bumps (241, 242, 243, 244). The functional layer 260 is, for example, a plating film of nickel, tin, palladium, gold, or the like. The functional layer 260 may not be essential.

Modified Example

Figure 7:
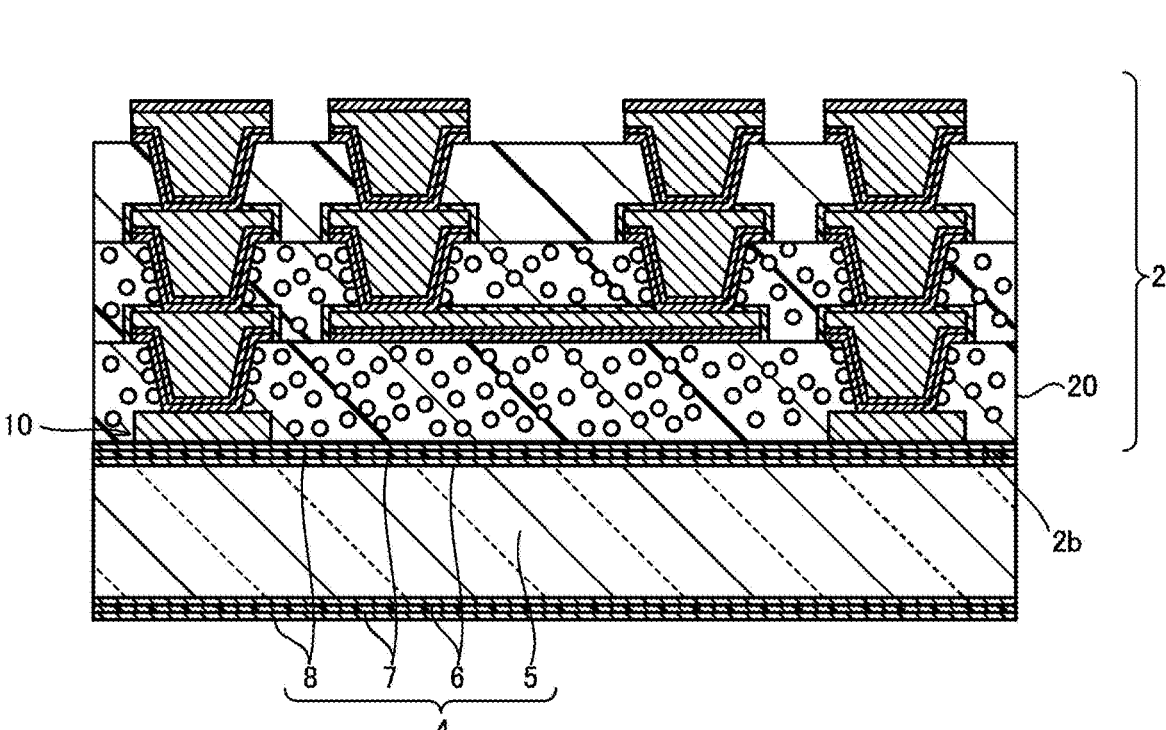
FIG. 7 is a cross-sectional view schematically illustrating a printed wiring board of a modified example according to an embodiment of the present invention.

FIG. 7 is a cross-sectional view illustrating a printed wiring board 3 of a modified example according to an embodiment of the present invention. As illustrated in FIG. 7, the printed wiring board 3 includes the printed wiring board 2 of the embodiment and a support 4. The support 4 is attached to the lower surface (2b) of the printed wiring board 2 of the embodiment. The support 4 includes a base material 5, a first metal layer 6 laminated on both sides of the base material 5, a release layer 7 formed on the first metal layer 6, and a second metal layer 8 laminated on the release layer 7. The printed wiring board 2 of the embodiment is laminated on the second metal layer 8.

An example of the base material 5 is a substrate containing a reinforcing material such as glass, silicon, or glass fiber. The base material 5 has a higher rigidity than the printed wiring board 2. Therefore, in the modified example printed wiring board 3, connection reliability between the printed wiring board and the electronic components (such as the first electronic component (E1) and the second electronic component (E2)) can be increased.

Method for Manufacturing Printed Wiring Board

Figure 8A:
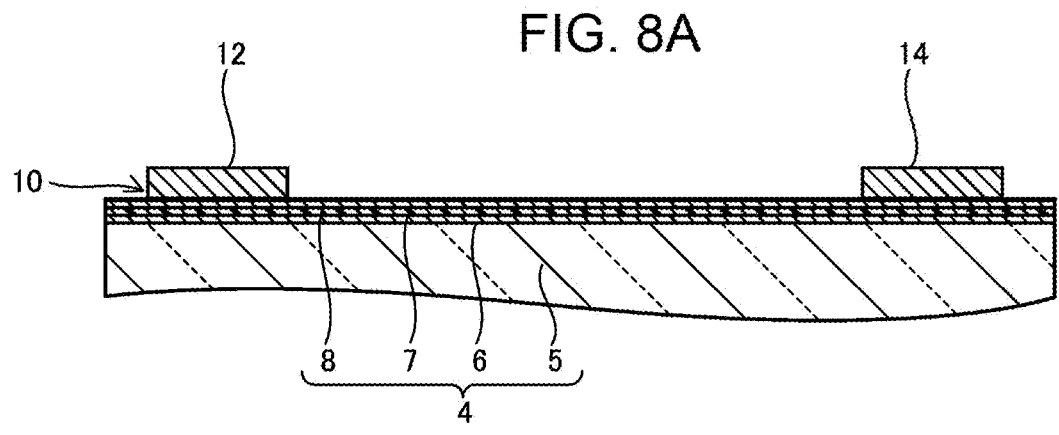
FIG. 8A is a cross-sectional view schematically illustrating a method for manufacturing a printed wiring board according to an embodiment of the present invention.
Figure 8B:
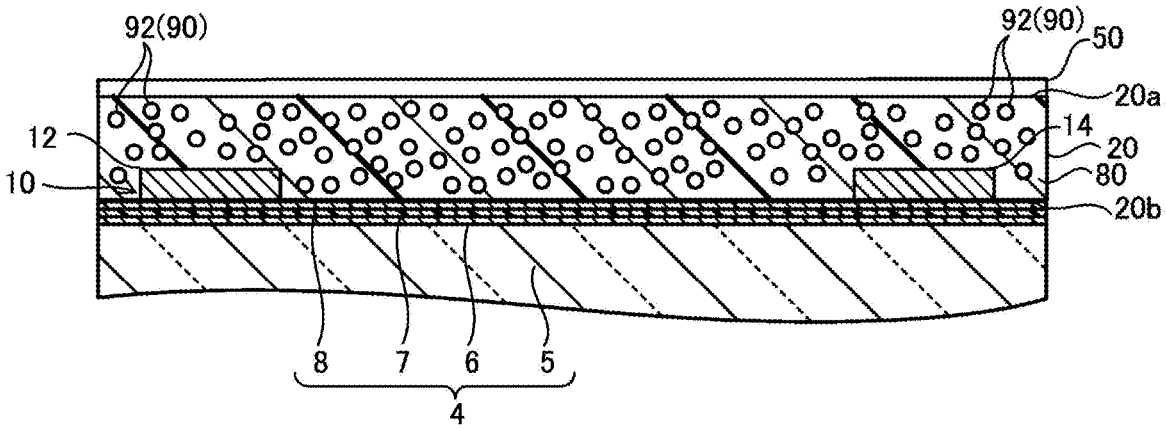
FIG. 8B is a cross-sectional view schematically illustrating a method for manufacturing a printed wiring board according to an embodiment of the present invention.
Figure 8C:
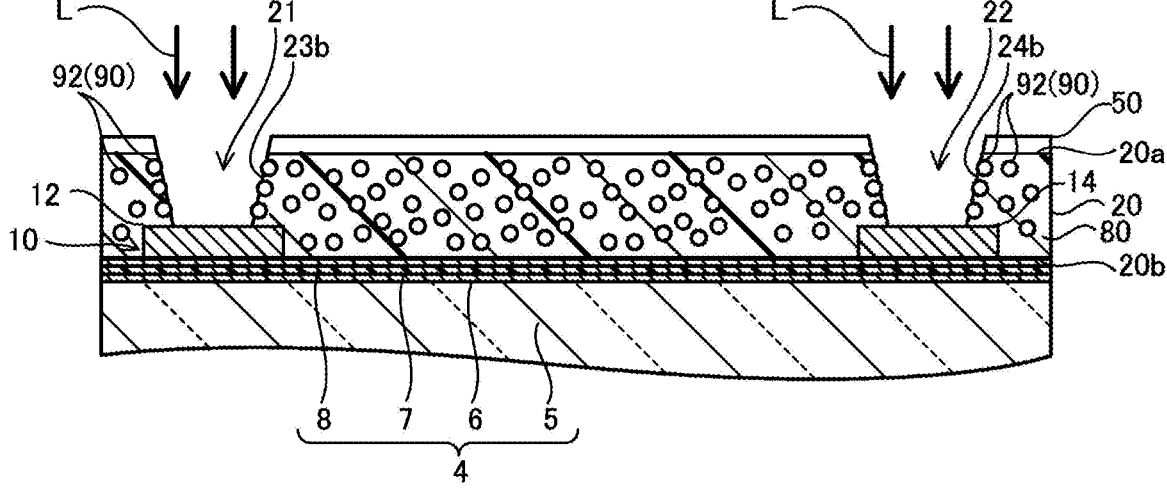
FIG. 8C is a cross-sectional view schematically illustrating a method for manufacturing a printed wiring board according to an embodiment of the present invention.
Figure 8D:
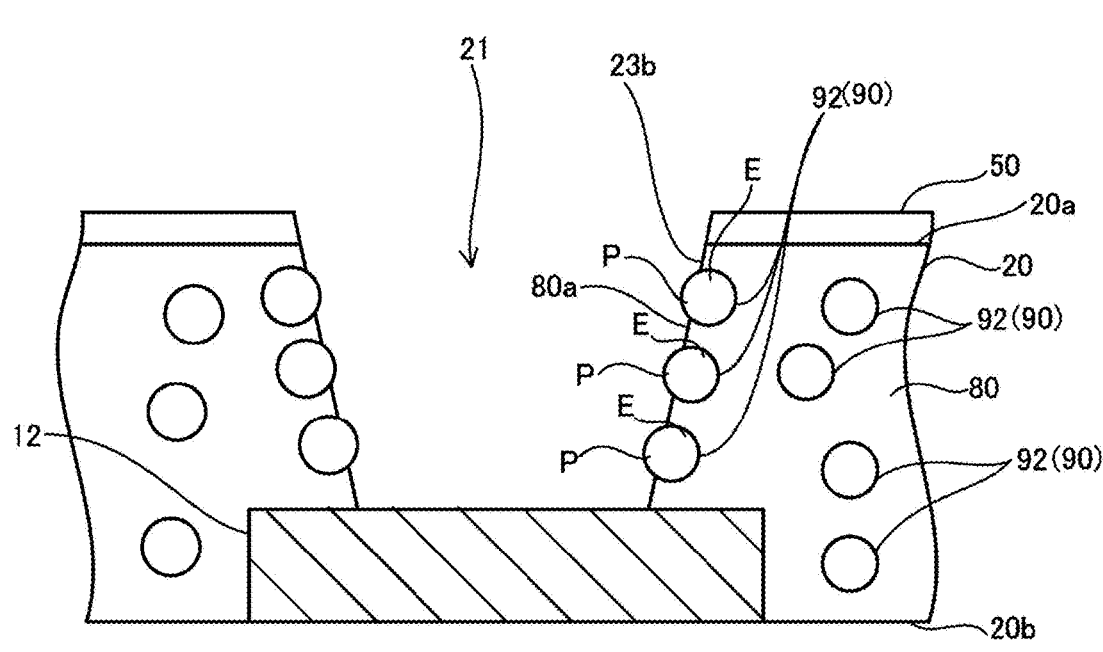
FIG. 8D is an enlarged cross-sectional view schematically illustrating a method for manufacturing a printed wiring board according to an embodiment of the present invention.
Figure 8E:
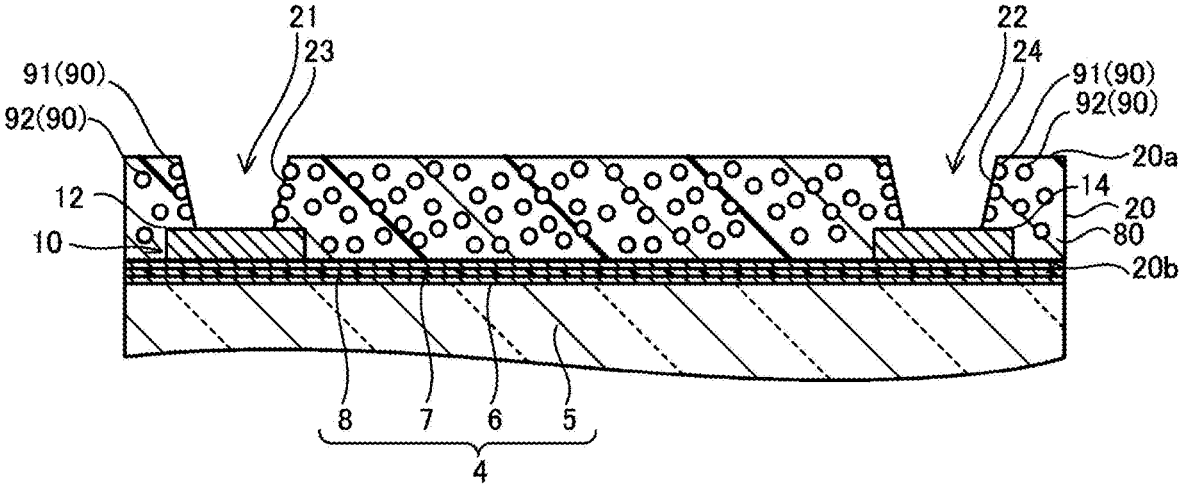
FIG. 8E is a cross-sectional view schematically illustrating a method for manufacturing a printed wiring board according to an embodiment of the present invention.
Figure 8F:
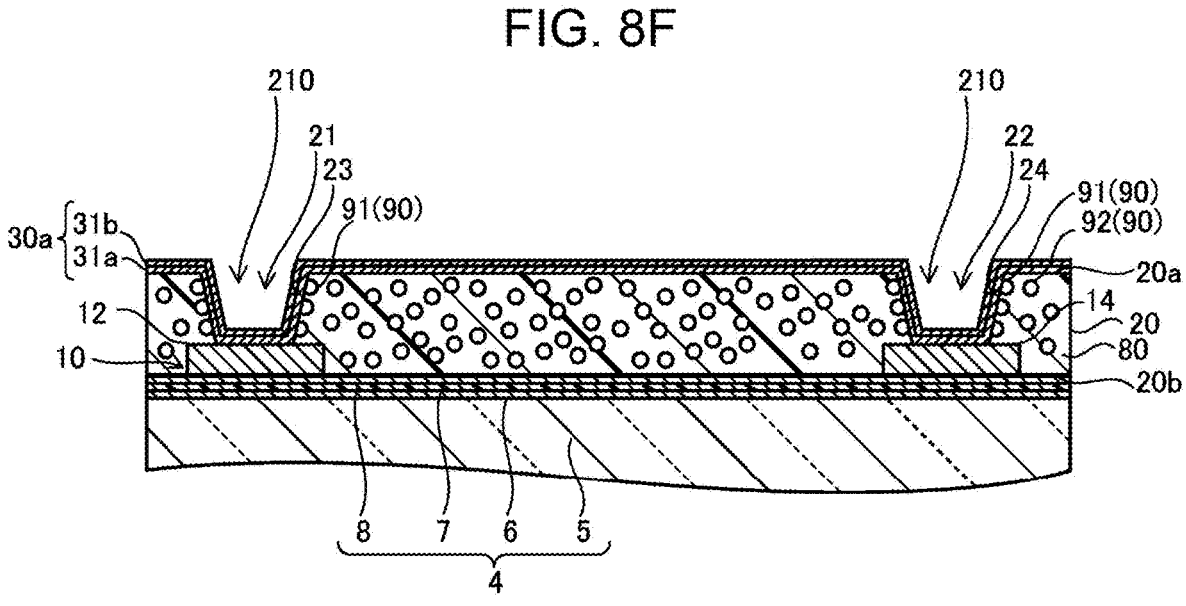
FIG. 8F is a cross-sectional view schematically illustrating a method for manufacturing a printed wiring board according to an embodiment of the present invention.
Figure 8G:
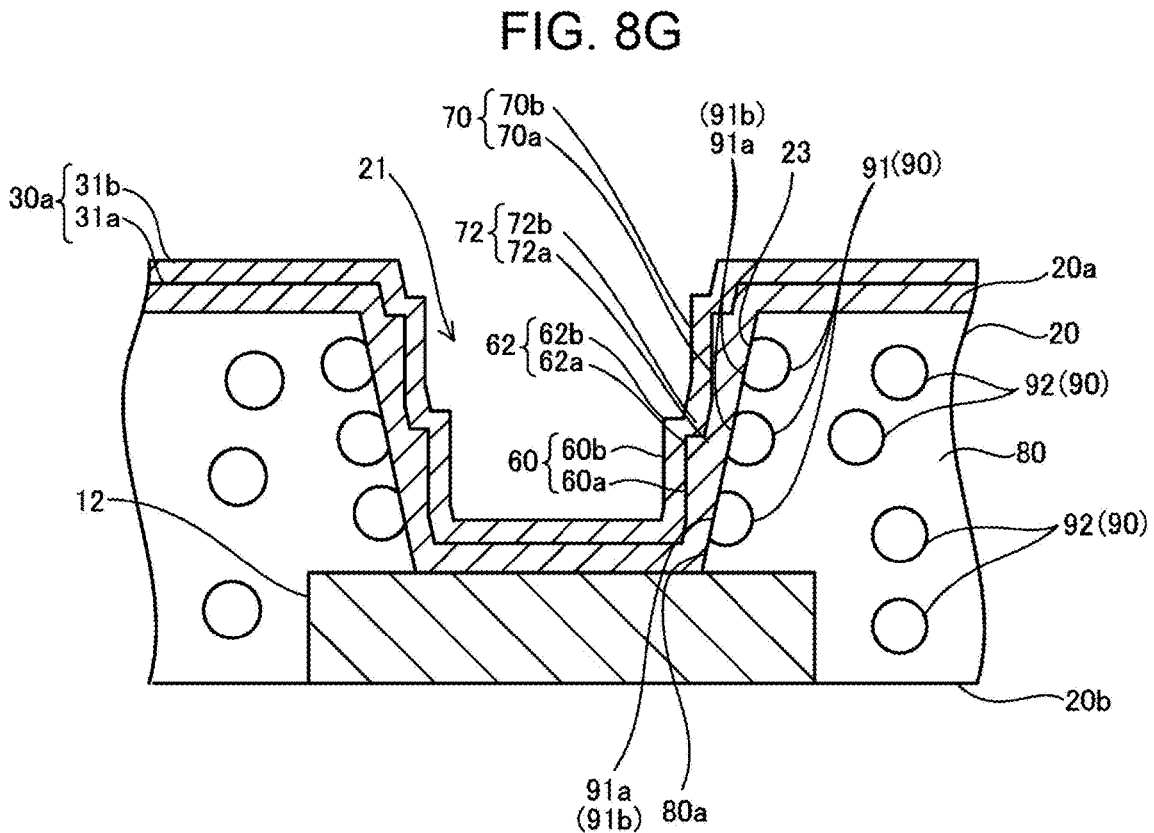
FIG. 8G is an enlarged cross-sectional view schematically illustrating a method for manufacturing a printed wiring board according to an embodiment of the present invention.

FIGS. 8A-8I illustrate a method for manufacturing the printed wiring board 2 according to an embodiment of the present invention. FIGS. 8A-8C, 8E, 8F, 8H, and 8I are cross-sectional views. FIGS. 8D and 8G are enlarged cross-sectional views. FIG. 8A illustrates a support 4 and the conductor layer 10 formed on the support 4. The support 4 is the same as the support 4 in FIG. 7. A plating resist is formed on the second metal layer 8. The conductor layer 10 including the pads (12, 14) is formed on the second metal layer 8 exposed from the plating resist. The second metal layer 8 functions as a seed layer for forming the conductor layer 10. After that, the plating resist is removed. Before removing the plating resist, the upper surface of the conductor layer 10 can be polished, for example, by CMP (Chemical Mechanical Polishing).

As illustrated in FIG. 8B, the resin insulating layer (first resin insulating layer) 20 and the protective film 50 are formed on the second metal layer 8 and on the conductor layer 10. The second surface (20b) of the resin insulating layer 20 faces the second metal layer 8. The protective film 50 is formed on the first surface (20a) of the resin insulating layer 20. The resin insulating layer 20 has the resin 80 and the inorganic particles 90 (the second inorganic particles 92). The inorganic particles 90 are embedded in the resin 80. The first surface (20a) of the resin insulating layer 20 is formed only of the resin 80. The inorganic particles 90 are not exposed from the first surface (20a) of the resin insulating layer 20. The first surface (20a) of the resin insulating layer 20 does not include surfaces of the inorganic particles 90. No unevenness is formed on the first surface (20a) of the resin insulating layer 20.

As illustrated in FIG. 8C, laser (L) is irradiated from above the protective film 50. The laser (L) penetrates the protective film 50 and the resin insulating layer 20 at the same time. The via conductor openings (21, 22) reaching the pads (12, 14) of the conductor layer 10 are formed. The laser (L) is, for example, UV laser, or $CO_2$ laser. The pads (12, 14) are exposed from the openings (21, 22). When the via conductor openings (21, 22) are formed, the first surface (20a) of the resin insulating layer 20 is covered by a protective film 50. Therefore, when the via conductor openings (21, 22) are formed, even when the resin scatters, adherence of the resin to the first surface (20a) of the resin insulating layer 20 is suppressed.

FIG. 8D illustrates an inner wall surface (23*b*) of an opening (via conductor opening) after the laser irradiation. As a representative example of via conductor openings, an opening 21 is drawn. The openings 22 and the openings 21 are similar. An inner wall surface (24*b*) of each of the openings 22 and the inner wall surface (23*b*) of each of the openings 21 are similar. The inner wall surface (23*b*) is formed of the resin 80 and the inorganic particles 90 protruding from the resin 80. In order to control a shape of the inner wall surface, the inner wall surface (23*b*) after the laser irradiation is treated. It is preferable to selectively remove the inorganic particles 90 protruding from the resin 80. As a result, the first inorganic particles 91 are formed from the inorganic particles 90. For example, the inorganic particles 90 protruding from the resin 80 are selectively removed by treating the inner wall surface (23*b*) after the laser irradiation with a chemical. Or, the inorganic particles 90 protruding from the resin 80 are selectively removed by treating the inner wall surface (23*b*) after the laser irradiation with plasma. The selectively removing includes that an etching rate of the inorganic particles 90 is greater than an etching rate of the resin 80. For example, a difference in etching rate between the two is 10 or more times. Or, the difference in etching rate between the two is 50 or more times. Or, the difference in etching rate between the two is 100 or more times. By treating the inner wall surface (23*b*) after the laser irradiation, the first inorganic particles 91 having the flat parts (91*a*) are obtained. By controlling conditions for treating the inner wall surface (23*b*) after the laser irradiation, a shape of the inner wall surface 23 can be controlled. Examples of the conditions are a temperature, a concentration, a time, a type of gas, and a pressure. The etching rate of the inorganic particles 90 and the etching rate of the resin are controlled.

By irradiating the resin insulating layer 20 with the laser (L), some of the second inorganic particles 92 embedded in the resin 80 form the inner wall surface (23*b*) after the laser irradiation. The second inorganic particles 92 forming the inner wall surface (23*b*) after the laser irradiation are each formed of a protruding portion (P) protruding from the resin 80 and a portion (E) embedded in the resin 80. The inner wall surface (23*b*) after the laser irradiation is treated. For example, the inner wall surface (23*b*) is treated with plasma of a gas containing tetrafluoromethane. The protruding portions (P) are selectively removed, and the inner wall surface 23 of the embodiment is formed. The first inorganic particles 91 are formed from the second inorganic particles 92. By selectively removing the protruding portions (P), the first inorganic particles 91 having the flat parts (91*a*) are formed. The flat parts (91*a*) are flat surfaces. When the second inorganic particles 92 having spherical shapes are cut along a flat surface, the shapes of the first inorganic particles 91 are obtained. The inner wall surface 23 is formed of the flat parts (91*a*) and the surface (80*a*) of the resin 80, and the exposed surfaces (91*b*) of the flat parts (91*a*) and the surface (80*a*) of the resin 80 are substantially positioned on the same flat surface. For example, when the seed layer (30*a*) is formed on the inner wall surface (23*b*) by sputtering, the protruding portions (P) inhibit growth of a sputtering film (sputtering-deposited film). For example, a continuous seed layer (30*a*) is not formed on the inner wall surface (23*b*). Or, the seed layer (30*a*) is increased in thickness. A fine conductor circuit cannot be formed. In the embodiment, the protruding portions (P) are removed. In the embodiment, the seed layer (30*a*) formed by sputtering can be reduced in thickness. Even when the seed layer (30*a*) formed by sputtering is thin, a continuous seed layer (30*a*) can be obtained. The widths of the connection wirings 36 satisfy target values. The widths of the spaces 37 between adjacent connection wirings 36 satisfy target values. A via conductor formed on the inner wall surface (23*b*) having the protruding portions (P) is a via conductor of a reference example. When the via conductor of the reference example exists in a path, data transmitted from the first electronic component (E1) to the second electronic component (E2) pass through the via conductor of the reference example. In this case, it is thought that data may degrade due to influence of the protruding portions (P). In the embodiment, the protruding portions (P) are removed. The embodiment can suppress data degradation.

Forming the openings (via conductor openings) includes forming the inorganic particles 90 (the second inorganic particles 92) having the protruding portions (P). The opening 21 is a representative example of the openings (via conductor openings). The protruding portions (P) protrude from the resin 80 that forms the inner wall surface (23*b*) of the opening 21. The first inorganic particles 91 are formed by removing the protruding portions (P) of the inorganic particles 90 (the second inorganic particles 92). The inner wall surface 23 of the opening 21 includes the exposed surfaces (91*b*) of the first inorganic particles 91. The exposed surfaces (91*b*) of the first inorganic particles 91 are formed by removing the protruding portions (P).

Obtaining the shapes of the first inorganic particles 91 by cutting the second inorganic particles 92 having spherical shapes along a flat surface includes removing the protruding portions (P) of the inorganic particles 90. The actual inner wall surface 23 of the opening 21 is a substantially curved surface. Since the flat parts (91*a*) are formed by removing the protruding portions (P), the exposed surfaces (91*b*) of the flat parts (91*a*) each include a curved surface. That is, forming a common surface with the flat parts (91*a*) and the resin 80 includes forming the inner wall surface 23 formed with a substantially curved surface.

No unevenness is formed on the inner wall surface 23. The inner wall surface 23 is formed smooth. By controlling the conditions for treating the inner wall surface (23*b*) after the laser irradiation, a size of unevenness is controlled.

The inside of the opening 21 is cleaned. By cleaning the inside of the opening 21, resin residues generated when the opening 21 is formed are removed. The cleaning of the inside of the opening 21 is performed using plasma. That is, the cleaning is performed with a dry process. The cleaning includes a desmear treatment.

When the inside of the opening 21 is cleaned, the first surface (20*a*) of the resin insulating layer 20 is covered by the protective film 50. The first surface (20*a*) is not affected by the plasma. The first surface (20*a*) is formed only of the resin 80. No inorganic particles 90 are exposed from the first surface (20*a*). The first surface (20*a*) does not include surfaces of the inorganic particles 90. The first surface (20*a*) has no unevenness. The first surface (20*a*) is formed smooth.

When treating the inner wall surface (23*b*) after the laser irradiation includes cleaning the inside of the opening 21, in the embodiment, cleaning the inside of the opening 21 can be omitted.

As illustrated in FIG. 8E, after cleaning the inside of the via conductor openings (21, 22), the protective film 50 is removed from the resin insulating layer 20. When treating the inner wall surfaces (23*b*, 24*b*) after the laser irradiation includes cleaning the insides of the via conductor openings, the protective film 50 is removed from the resin insulating layer 20 after treating the inner wall surfaces (23*b*, 24*b*) after the laser irradiation. When the inner wall surfaces (23*b*, 24*b*) after the laser irradiation are treated, the protective film 50 covers the first surface (20a) of the resin insulating layer 20. After the protective film 50 is removed, no roughening of the first surface (20a) is performed.

As illustrated in FIG. 8F, the seed layer (30a) is formed on the first surface (20a). The seed layer (30a) is formed by sputtering. The formation of the seed layer (30a) is performed with a dry process. The seed layer (30a) is also formed on the inner wall surfaces (23, 24) of the via conductor openings and on the pads (12, 14) exposed from the via conductor openings (21, 22). The seed layer (30a) is mainly formed of copper. The first layer (31a) is formed on the first surface (20a) by sputtering. The first layer (31a) is also formed on the inner wall surfaces (23, 24) of the via conductor openings and on the pads (12, 14) exposed from the via conductor openings (21, 22). The second layer (31b) is formed on the first layer (31a) by sputtering. The inner wall surfaces (23, 24) of the via conductor openings are each formed of the exposed surfaces (91b) of the first inorganic particles 91 and the surface (80a) of the resin 80. The exposed surfaces (91b) and the surface (80a) of the resin 80 are positioned substantially on the same surface. The inner wall surfaces of the via conductor openings are substantially flat. Therefore, the first layer (31a) and the second layer (31b) on the inner wall surfaces can be reduced in thickness. Since the thickness of the seed layer (30a) is small, in the embodiment, variation in the thickness can be reduced. The first layer (31a) on the inner wall surfaces (23, 24) and the first layer (31a) on the first surface (20a) of the resin insulating layer 20 are formed at the same time. The second layer (31b) on the inner wall surfaces (23, 24) and the second layer (31b) on the first surface (20a) of the resin insulating layer 20 are formed at the same time. Therefore, in the embodiment, the first layer 31a and the second layer (31b) on the first surface (20a) of the resin insulating layer 20 can be reduced in thickness. In the embodiment, variation in the thickness of the first layer (31a) and variation in the thickness of the second layer (31b) on the first surface (20a) of resin insulating layer 20 can be reduced. The widths of the connection wirings 36 on the first surface (20a) of the resin insulating layer 20 satisfy target values. The widths of the spaces 37 between adjacent connection wirings 36 satisfy target values. In the embodiment, variation in the widths of the connection wirings 36 can be reduced. In the embodiment, variation in the widths of the spaces 37 can be reduced. Even when the multiple connection wirings 36 are formed on the first surface (20a) of the resin insulating layer 20, data transmitted via each connection wiring 36 reaches the electronic component with substantially no delay.

As illustrated in FIG. 8G, the first layer (31a) formed on the inner wall surface 23 has the first portion (60a) and the second portion (67a). The first portion (60a) and the second portion (67a) are formed at the same time. The first portion (60a) and the second portion (67a) are electrically connected. A leading end (62a) of the first portion (60a) is formed on a trailing end (72a) of the second portion (67a). The first layer (31a) formed on the inner wall surface 23 has a substantially step-shaped cross section. Examples of sputtering conditions are described below. A distance between a target and the first surface (20a) of the resin insulating layer 20 is 50 mm or more and 250 mm or less. A voltage is 15 eV or more and 50 eV or less. A gas concentration is 0.1 Pa or more and 1.0 Pa or less.

The second layer (31b) formed on the first layer (31a) covering the inner wall surface 23 has the first portion (60b) and the second portion (70b). The first portion (60b) and the second portion (70b) are formed at the same time. The first portion (60b) and the second portion (70b) are electrically connected. A leading end (62b) of the first portion (60b) is formed on a trailing end (72b) of the second portion (70b). The second layer (31b) formed on the inner wall surface 23 has a substantially step-shaped cross section. Sputtering conditions are substantially the same as those described above.

The inner wall surface 23 of the embodiment is formed of the surface (80a) of the resin 80 and the exposed surfaces (91b) of the first inorganic particles 91. These surfaces form a substantially common surface. The surface (80a) of the resin and the exposed surfaces (91b) are formed of different materials. And, the first layer (31a) is formed by sputtering. It is thought that growth of the first layer (31a) formed on the surface (80a) of the resin 80 and growth of the first layer (31a) formed on the exposed surfaces (91b) are different from each other. It is thought that growth of the seed layer (30a) formed on the surface (80a) of the resin 80 and growth of the seed layer (30a) formed on the exposed surfaces (91b) are different from each other. Therefore, in the embodiment, the first portion (60a) and the second portion (67a) are formed. The leading end (62a) of the first portion (60a) is formed on the trailing end (72a) of the second portion (67a). The first layer (31a) has a substantially step-shaped cross section. It is thought that the second layer (31b) follows the first layer (31a). Therefore, the second layer (31b) has the first portion (60b) and the second portion (70b). The leading end (62b) of the first portion (60b) of the second layer (31b) is formed on the trailing end (72b) of the second portion (70b) of the second layer (31b). The second layer (31b) has a substantially step-shaped cross section. Similarly, the seed layer (30a) has the first portion 60 and the second portion 70. The leading end 62 of the first portion 60 of the seed layer (30a) is formed on the trailing end 72 of the second portion 70 of the seed layer (30a). The seed layer (30a) has a substantially step-shaped cross section.

When the inner wall surface 23 has the steps 28 shown in FIG. 5, the first layer (31a) having the first portion (60a) and the second portion (67a) can be easily formed by sputtering. In the embodiment, the seed layer (30a) having the first portion 60 and the second portion 70 can be easily formed. In the embodiment, the leading end (62a) of the first portion (60a) can be formed on the trailing end (72a) of the second portion (67a). In the embodiment, the leading end 62 of the first portion 60 can be formed on the trailing end 72 of the second portion 70. In the embodiment, the first layer (31a) having a substantially stepped shape can be easily formed. In the embodiment, the seed layer (30a) having a substantially stepped shape can be easily formed.

The first layer (31a) on the inner wall surface 23 is formed on the substantially smooth inner wall surface 23. Therefore, in the embodiment, the first portion (60a) of the first layer (31a) and the second portion (67a) of the first layer (31a) can be formed to have substantially smooth surfaces. Similarly, in the embodiment, the first portion (60b) of the second layer (31b) and the second portion (70b) of the second layer (31b) can be formed to have substantially smooth surfaces. In the embodiment, the first portion 60 of the seed layer (30a) and the second portion 70 of the seed layer (30a) can be formed to have substantially smooth surfaces. When the surfaces are smooth, transmission loss can be reduced.

The first layer (31a) is formed of a copper alloy. The first layer (31a) of the seed layer (30a) is formed of an alloy containing copper, aluminum and silicon. Aluminum has high ductility and high malleability. Therefore, adhesion between resin insulating layer 20 and the first layer (31a) is high. It is thought that, even when the resin insulating layer 20 expands and contracts due to heat cycles, the seed layer (30a) containing aluminum can follow the expansion and contraction. Even when the first surface (20a) of the resin insulating layer 20 is smooth, the seed layer (30a) is unlikely to peel off from the resin insulating layer 20. It is thought that aluminum is easily oxidized. It is thought that, when the first inorganic particles 91 are inorganic particles 90 containing oxygen (oxygen elements), the first layer (31a) formed on the inner wall surfaces (23, 24) adheres to the first inorganic particles 91 via the oxygen in the inorganic particles 90 forming the inner wall surfaces (23, 24). The first layer (31a) and each of the inner wall surfaces (23, 24) are strongly bonded to each other. In the embodiment, adhesion between each of the inner wall surfaces (23, 24) and the first layer (31a) can be increased. The seed layer (30a) is unlikely to peel off from the inner wall surfaces (23, 24). The inorganic particles 90 forming the inner wall surfaces (23, 24) preferably contain oxygen elements.

A plating resist is formed on the seed layer (30a). The plating resist has openings for forming the via conductors (41, 42), the connection wirings 36, and the pads (32, 34) extending from the connection wirings 36.

The electrolytic plating layer (30b) is formed on the seed layer (30a) exposed from the plating resist. The electrolytic plating layer (30b) fills the openings of the plating resist. The electrolytic plating layer (30b) fills the openings (21, 22). A portion of the electrolytic plating layer (30b) protrudes above an upper surface of the plating resist. In this case, the electrolytic plating layer (30b) partially covers the upper surface of the plating resist. Or, the electrolytic plating layer (30b) completely covers the upper surface of the plating resist.

The electrolytic plating layer (30b) is polished. By the polishing, the electrolytic plating layer (30b) is reduced in thickness. A combined thickness of the electrolytic plating layer (30b) and the seed layer (30a) reaches a predetermined value. The plating resist is also polished along with the electrolytic plating layer (30b). An example of a polishing method is CMP. After the polishing, the upper surface of the electrolytic plating layer (30b) has an arithmetic mean roughness (Ra) of 0.3 µm or less.

Figure 8H:
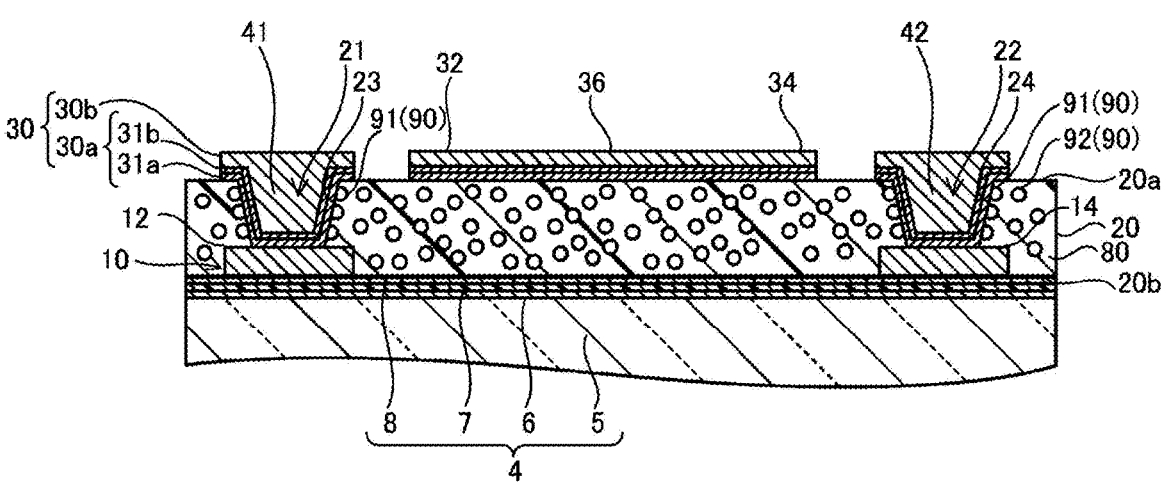
FIG. 8H is a cross-sectional view schematically illustrating a method for manufacturing a printed wiring board according to an embodiment of the present invention.

After the polishing of the electrolytic plating layer (30b), the plating resist is removed. The seed layer (30a) exposed from the electrolytic plating layer (30b) is removed. As illustrated in FIG. 8H, the pads (32, 34) and the connection wirings 36 are formed by the seed layer (30a) and the electrolytic plating layer (30b) on the resin insulating layer 20. The connection conductor layer 30 is formed. The via conductors (41, 42) are formed by the seed layer (30a) and electrolytic plating layer (30b) in the via conductor openings (21, 22). The connection conductor layer 30 and the via conductors (41, 42) are formed at the same time.

Figure 8I:
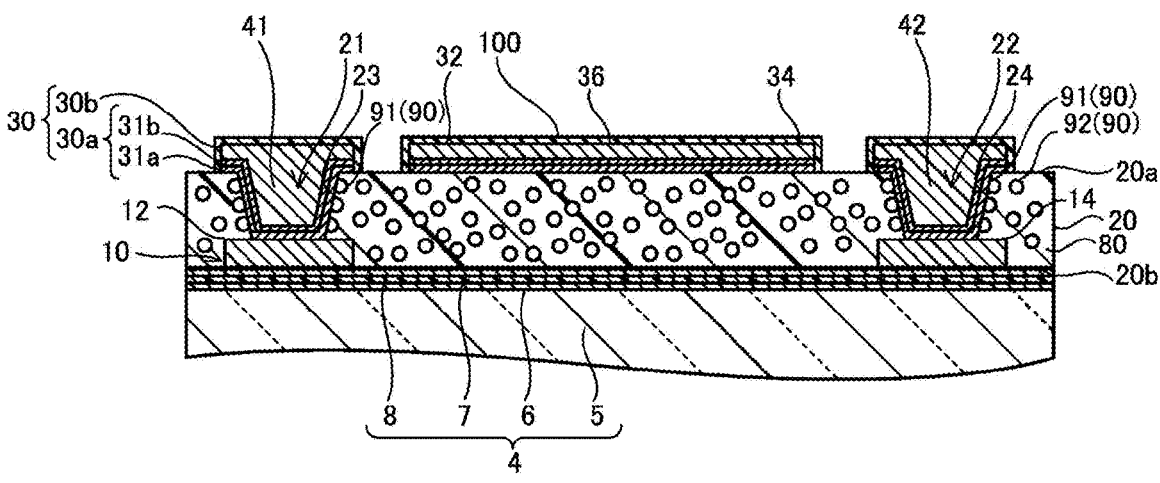
FIG. 8I is a cross-sectional view schematically illustrating a method for manufacturing a printed wiring board according to an embodiment of the present invention.

As illustrated in FIG. 8I, the adhesive layer 100 is formed on the upper and side surfaces of the connection conductor layer 30. The adhesive layer 100 is formed by immersing the intermediate substrate illustrated in FIG. 8H in a chemical solution containing a nitrogen-based organic compound. The chemical solution has a pH or 7 or less. By immersing the intermediate substrate in the chemical solution, the adhesive layer 100 including the smoothing film 102 and the protruding parts 104 is formed on the upper and side surfaces of the connection conductor layer 30. Before the intermediate substrate is immersed in the chemical solution, an oxide film on the upper and side surfaces of the connection conductor layer 30 is removed. In a modified example, the adhesive layer 100 is formed by applying a chemical solution on the connection conductor layer 30. When the adhesive layer 100 is formed, the intermediate substrate is taken out from the chemical solution. The adhesive layer 100 is dried. The upper surface of the adhesive layer 100 before the drying may be smooth. In this case, by the drying, a part of the adhesive layer aggregates. By the aggregating, the adhesive layer 100 including the smooth film 102 and the protruding parts 104 is formed.

The resin insulating layer (second resin insulating layer) 120, the mounting conductor layer 130, and the via conductors (141, 142, 143, 144) are formed on the connection conductor layer 30 and the resin insulating layer 20. The via conductors include connection via conductors. Examples of the connection via conductors are the first connection via conductor 141 and the second connection via conductor 142. The resin insulating layer 120 and the resin insulating layer 20 are formed using similar methods. The mounting conductor layer 130 and the connection conductor layer 30 are formed using similar methods. The via conductors (141, 142, 143, 144) and the via conductors (41, 42) are formed using similar methods. When the via conductor openings (121, 122, 123, 124) are formed in the resin insulating layer 120 using the laser (L), the laser (L) removes the adhesive layer 100 covering the connection conductor layer 30. Or, the adhesive layer 100 is not completely removed by the laser (L). In this case, the adhesive layer 100 at bottoms of the via conductor openings (121, 122, 123, 124) is removed by cleaning the insides of the via conductor openings (121, 122, 123, 124). The via conductor openings (121, 122, 123, 124) expose the connection conductor layer 30. The via conductor openings include connection via conductor openings. Examples of connection via conductor openings are the first openings (first connection via conductor openings) 121 and the second openings (second connection via conductor openings) 122.

In the embodiment, the first layer forming the connection via conductors can be reduced in thickness. In the embodiment, the second layer forming the connection via conductors can be reduced in thickness. The first layer and the second layer form the seed layer. A volume of each of the connection via conductor openings after the seed layer is formed can be increased. The connection via conductor openings after the seed layer is formed can be referred to as post-seed layer formation openings. By forming the electrolytic plating layer in the post-seed layer formation openings, the connection via conductors formed of the seed layer and the electrolytic plating layer are formed. Even when the connection via conductor openings have small diameters, an electrolytic plating solution can easily enter the connection via conductor openings after the seed layer is formed. The electrolytic plating layer forming the connection via conductors is unlikely to contain voids. Low resistance connection via conductors are formed. Even when a path includes connection via conductors, the printed wiring board 2 of the embodiment can transmit high-speed data. An example of post-seed layer formation openings 210 is illustrated in FIG. 8F. The post-seed layer formation openings 210 are surrounded by the seed layer. The bottom and side surfaces of the openings 210 are in contact with the seed layer.

The adhesive layer 150 is formed on the upper and side surfaces of the mounting conductor layer 130. The adhesive layer 150 and the adhesive layer 100 are similar. The insulating layer 220 is formed on the mounting conductor layer 130 and the resin insulating layer 120. The insulating layer 220 has the openings (221, 222, 223, 224) that expose the electrodes (such as the first electrodes 131 and the second electrodes 132). The bumps (such as the first bumps 241 and the second bumps 242) are formed on the electrodes (131, 132, 133, 134) exposed by the openings (221, 222, 223, 224). The functional layer 260 is formed on the bumps (241, 242, 243, 244). The printed wiring board 3 of the modified example is obtained.

The support 4 is removed. For example, by heating or ultraviolet irradiation, the release layer 7 of the support 4 softens or becomes brittle. The first metal layer 6 and the second metal layer 8 are separated from each other. After that, the second metal layer 8 is removed by etching. The lower surface (2b) of the printed wiring board 2 is exposed. The printed wiring board 2 of the embodiment is obtained.

In the printed wiring board 2 of the embodiment, the inner wall surface of each of the via conductor openings is formed by the flat parts (91a) of the first inorganic particles 91 and the resin 80. The flat parts (91a) and the surface (80a) of the resin 80 that forms the inner wall surface form a substantially common surface. The inner wall surface is formed smooth. Therefore, the seed layer (30a) having a uniform thickness is formed on the inner wall surface of each of the openings. The seed layer (30a) is formed thin. When the seed layer (30a) is removed, an etching amount is small. Therefore, an etching amount of the electrolytic plating layer (30b) is small. Conductor circuits in the connection conductor layer 30 and the mounting conductor layer 130 have widths as designed. A high quality printed wiring board 2 is provided.

Figure 9:
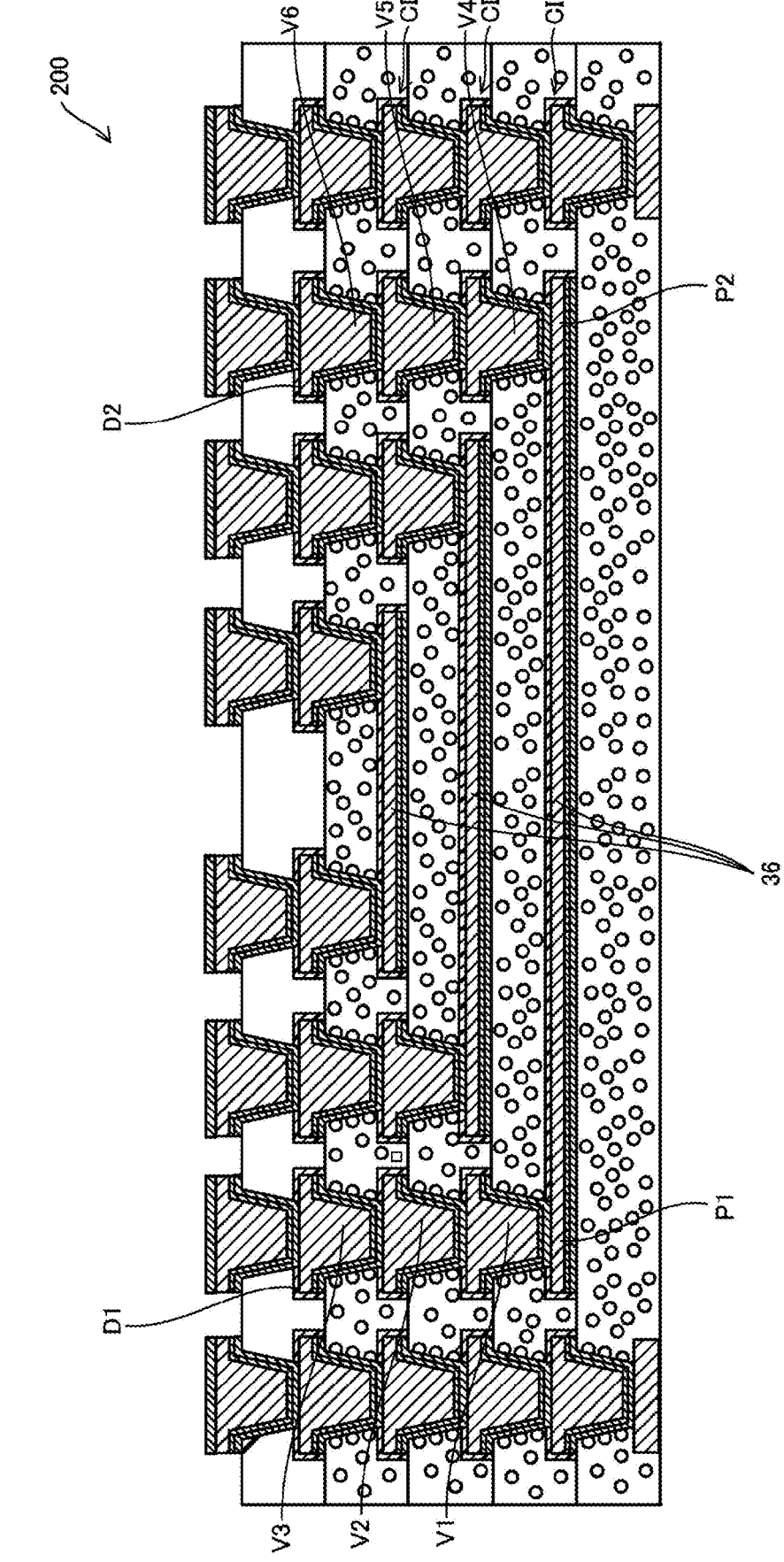
FIG. 9 is a cross-sectional view schematically illustrating a printed wiring board having three connection inner conductor layers.

Data is transmitted from the first electronic component (E1) to the second electronic component (E2) via the connection wirings 36. When data is transmitted, low loss is preferred. When the connection conductor layer is an inner-layer conductor layer, a path for data transmission between the first electronic component (E1) and the second electronic component (E2) includes via conductors connected to the connection wirings. The via conductors forming the path are connection via conductors. Even when the path includes the via conductors (connection via conductors), the inner wall surface of each of the openings for the connection via conductors of the printed wiring board 2 of the embodiment is formed of the exposed surfaces (91b) of the first inorganic particles 91 and the surface (80a) of the resin 80. The inner wall surface is substantially flat. According to the embodiment, when data passes through the via conductors, the printed wiring board 2 of the embodiment can suppress losses. The inner-layer conductor layer is sandwiched between adjacent resin insulating layers. When there are multiple connection conductor layers (connection inner conductor layers) formed of inner-layer conductor layers, the number of the connection inner conductor layers (CI) is preferably three or more. The number of the connection inner conductor layers (CI) is preferably seven or less. Further, the number of the connection inner conductor layers (CI) is preferably five or less. An example of a printed wiring board 200 having three connection inner conductor layers (CI) is illustrated in FIG. 9. As illustrated in FIG. 9, when a path connecting a first connection pad (P1) and a first connection electrode (D1) includes multiple via conductors (V1, V2, V3), all the via conductors (V1, V2, V3) in the path are formed in via conductor openings similar to the opening 21 illustrated in FIG. 4A. The via conductor (V1), the via conductor (V2), and the via conductor (V3) are first connection via conductors and form a first path. The via conductor (V1), the via conductor (V2), and the via conductor (V3) are formed in different resin insulating layers. When a path connecting a second connection pad (P2) and a second connection electrode (D2) includes multiple via conductors (V4, V5, V6), all the via conductors (V4, V5, V6) in the path are formed in via conductor openings similar to the opening 21 illustrated in FIG. 4A. The via conductor (V4), the via conductor (V5), and the via conductor (V6) are second connection via conductors and form a second path. The via conductor (V4), the via conductor (V5), and the via conductor (V6) are formed in different resin insulating layers.

The connection inner conductor layers are preferably each sandwiched between resin insulating layers containing the first inorganic particles 91 and the second inorganic particles 92. The resin insulating layers sandwiching a connection inner conductor layer both have via conductor openings. And, an inner wall surface of each of the via conductor openings is formed of the exposed surfaces (91b) of the first inorganic particles 91 and the surface (80a) of the resin 80. The connection wirings forming the connection inner conductor layers have widths close to design values. In the embodiment, high-density connection wiring groups can be formed.

Since the inner wall surfaces of the via conductor openings are each formed of the exposed surfaces (91b) of the first inorganic particles 91 and the surface (80a) of the resin 80, inner wall surfaces of the via conductors have substantially the same shape. Even when there are multiple paths that include the connection via conductors, in the embodiment, a difference in transmission speed between the paths can be reduced.

In the embodiment, a part of the first portion of the seed layer that covers the inner wall surface of each of the via conductor openings (the first openings and the second openings) is formed on the second portion (FIGS. 4A and 5). The first portion and the second portion partially overlap. Therefore, strength of the seed layer is high. When the printed wiring board 2 is subjected to heat cycles, a stress acts between the resin insulating layer and the seed layer. Even when the resin insulating layer expands and contracts due to heat cycles, it is thought that the stress can be relaxed by partial overlapping the first portion and the second portion. Or, it is thought that the seed layer can follow the expansion and contraction. Therefore, the seed layer is unlikely to break. The seed layer is formed of the substantially smooth first portion and the substantially smooth second portion. Therefore, transmission loss is low when a high frequency signal is transmitted. A high quality printed wiring board 2 is provided.

In the printed wiring board 2 of the embodiment, the first surface (20a) of the resin insulating layer 20 is formed of the resin 80. No inorganic particles 90 are exposed on the first surface (20a). No unevenness is formed on the first surface (20a). An increase in standard deviation of a relative permittivity in a portion near the first surface (20a) of the resin insulating layer 20 is suppressed. The relative permittivity of the first surface (20a) of the resin insulating layer 20 does not significantly vary depending on a location. Even when the multiple connection wirings 36 are in contact with the first surface (20a) of the resin insulating layer 20, in the embodiment, a difference in electrical signal propagation speed between the connection wirings 36 can be reduced. Therefore, in the printed wiring board 2 of the embodiment, noise is suppressed. Even when a logic IC is mounted on the printed wiring board 2 of the embodiment, data transmitted via the connection wirings 36 reaches the logic IC substantially simultaneously. In the embodiment, malfunction of the logic IC can be suppressed. Even when the connection wirings 36 have lengths of 5 mm or more, the difference in propagation speed can be reduced. Even when the connection wirings 36 have lengths of 10 mm or more and 20 mm or less, in the embodiment, malfunction of the logic IC can be suppressed. The first surface (120a) of the resin insulating layer 120 is also similar to the first surface (20*a*) of the resin insulating layer 20. Therefore, the connection wirings in the mounting conductor layer 130 also have similar effects to the connection wirings 36 in the connection conductor layer 30. A high quality printed wiring board 2 is provided.

The printed wiring board 2 of the embodiment has the adhesive layer 100 between the connection conductor layer 30 and the resin insulating layer 120. The adhesive layer 100 adheres the connection conductor layer 30 and the resin insulating layer 120. Therefore, even when the upper and side surfaces of the connection wirings 36 are smooth, the resin insulating layer 120 is unlikely to peel off from the connection wirings 36. Preferably, the upper and side surfaces of the connection wirings 36 are not roughened. The adhesive layer 100 is formed of the smooth film 102, which is substantially smooth, and the protruding parts 104 protruding from the smooth film 102. The adhesive layer 100 has unevenness formed by the protruding parts 104 and the smooth film 102. The adhesive layer 100 has unevenness formed by the multiple protrusions 106. Therefore, the connection conductor layer 30 and the resin insulating layer 120 are sufficiently adhered to each other via the adhesive layer 100. A high quality printed wiring board 2 is provided. For example, even when each side of the printed wiring board 2 has a length of 50 mm or more, the resin insulating layer 120 is unlikely to peel off from the connection conductor layer 30. Even when each side of the printed wiring board 2 has a length of 100 mm or more, a crack caused by the adhesive layer 100 is unlikely to occur in the resin insulating layer 120. Even when the connection conductor layer 30 includes a conductor circuit having a width of 5 μm or less, the resin insulating layer 120 is unlikely to peel off from the connection conductor layer 30. Even when the connection conductor layer 30 includes a conductor circuit having a width of 3 μm or less, a crack caused by the adhesive layer 100 is unlikely to occur in the resin insulating layer 120. The adhesive layer 150 formed between the mounting conductor layer 130 and the insulating layer 220 also has similar effects to the adhesive layer 100. A high quality printed wiring board 2 is provided.

When the first layer contains silicon as the specific metal and the inorganic particles are glass particles, the first layer and the first inorganic particles on the inner wall surface contain silicon. It is thought that the two are strongly bonded to each other via silicon. The seed layer is unlikely to peel off from the inner wall surface.

When the first layer contains aluminum and the inorganic particles contain oxygen, it is thought that the first layer and the first inorganic particles (inorganic particles containing oxygen such as glass particles) are strongly bonded. When the first layer contains aluminum and the inorganic particles contain oxygen, the first layer does not need to contain the specific metal. In this case, the first layer is formed of copper, aluminum, and impurities.

First Alternative Example

In a first alternative example according to an embodiment of the present invention, the specific metal contained in the alloy forming the first layer is at least one of nickel, zinc, gallium, silicon, and magnesium.

Second Alternative Example

In a second alternative example according to an embodiment of the present invention, the alloy forming the first layer does not contain carbon.

Third Alternative Example

In a third alternative example according to an embodiment of the present invention, the alloy forming the first layer does not contain oxygen.

In the present specification, the term "flat surface" is used with respect to the shape of the inner wall surface, the shapes of the flat parts (91*a*), and the shapes of the first inorganic particles 91. The meaning of the "flat surface" used with respect to these is illustrated in FIGS. 2 and 4A. That is, in FIGS. 2 and 4A, the inner wall surface is drawn substantially straight. The shape of the inner wall surface in FIGS. 2 and 4A is substantially a straight line. The term "flat surface" in the present specification includes a substantially straight line illustrated in a cross section. As illustrated in the cross sections of the first inorganic particles 91 in FIGS. 2 and 4A, in a cross section, cutting along a flat surface includes cutting along a straight line. The term "flat surface" in the present specification does not mean a perfect flat surface, but includes a substantially flat surface. A substantially flat surface may include small unevenness.

Japanese Patent Application Laid-Open Publication No. 2015-126103 describes a printed wiring board having a first conductor layer, an insulating layer formed on the first conductor layer, and a second conductor layer formed on the insulating layer. The insulating layer has via conductor through holes exposing the first conductor layer. Via conductors connecting the first conductor layer and the second conductor layer are formed in the through holes. The via conductors are each formed of an electroless plating layer and an electrolytic plating layer. The insulating layer contains a resin and inorganic particles.

As illustrated in FIG. 17 of Japanese Patent Application Laid-Open Publication No. 2015-126103, in Japanese Patent Application Laid-Open Publication No. 2015-126103, an intermediate layer is provided on a wall surface (inner circumferential surface) of each of the through holes. The intermediate layer has a complex uneven surface due to gaps formed between the inorganic particles. The inorganic particles contained in the intermediate layer are the same as the inorganic particles contained in the insulating layer. As illustrated in FIG. 22 of Japanese Patent Application Laid-Open Publication No. 2015-126103, in Japanese Patent Application Laid-Open Publication No. 2015-126103, an electroless plating film is formed in the through hole. The electroless plating film is formed along a shape of the unevenness formed in the intermediate layer. Or, the gaps formed in the intermediate layer are filled with the electroless plating film. However, it is thought that, in the technology of Japanese Patent Application Laid-Open Publication No. 2015-126103, a side wall of the via conductor (a portion in contact with the inner wall surface of the through hole) has a large degree of roughness. It is thought that transmission loss is large when a high frequency signal is transmitted.

A printed wiring board according to an embodiment of the present invention includes: a mounting conductor layer that has first electrodes for mounting a first electronic component and second electrodes for mounting a second electronic component; a connection conductor layer that is positioned below the mounting conductor layer and has connection wirings electrically connecting the first electrodes and the second electrodes; a resin insulating layer that is formed between the mounting conductor layer and the connection conductor layer and has multiple openings including first openings and second openings; first connection via conductors that are formed in the first openings and electrically connect the first electrodes and the connection wirings; and second connection via conductors that are formed in the second openings and electrically connect the second electrodes and the connection wirings. The first connection via conductors and the second connection via conductors are formed of a seed layer and an electrolytic plating layer on the seed layer. The seed layer covering an inner wall surface of each of the openings has a substantially smooth first portion and a substantially smooth second portion. The first portion and the second portion are electrically connected to each other, and a part of the first portion is formed on the second portion.

In a printed wiring board according to an embodiment of the present invention, the seed layer is formed of the substantially smooth first portion and the substantially smooth second portion. Therefore, transmission loss is low when a high frequency signal is transmitted. A part of the first portion is formed on the second portion. The first portion and the second portion partially overlap. Therefore, strength of the seed layer is high. A high quality wiring substrate is provided.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
a connection conductor layer comprising a plurality of connection wirings;
a resin insulating layer formed on the connection conductor layer and having a plurality of openings;
a mounting conductor layer formed on the resin insulating layer and comprising a plurality of first electrodes and a plurality of second electrodes;
a plurality of first connection via conductors formed in the resin insulating layer and comprising a seed layer and an electrolytic plating layer formed on the seed layer such that the first connection via conductors electrically connect the first electrodes and the connection wirings; and
a plurality of second connection via conductors formed in the resin insulating layer and comprising the seed layer and the electrolytic plating layer formed on the seed layer such that the second connection via conductors electrically connect the second electrodes and the connection wirings,
wherein the mounting conductor layer is formed such that the plurality of first electrodes is positioned to mount a first electronic component and that the plurality of second electrodes is positioned to mount a second electronic component, and the first and second connection via conductors are formed such that the seed layer is covering an inner wall surface of each of the openings in the resin insulating layer and has a first portion and a second portion connected to the first portion and having a part of the first portion formed on the second portion.

2. The printed wiring board according to claim 1, wherein the seed layer in the first and second connection via conductors is formed such that a leading end of the first portion is formed on a trailing end of the second portion.

3. The printed wiring board according to claim 2, wherein the connection conductor layer is formed such that the connection wirings are formed substantially parallel to each other and include a connection wiring having a smallest width in a range of 1 μm to 3 μm and that a smallest space between adjacent connection wirings has a width in a range of 1 μm to 3 μm.

4. The printed wiring board according to claim 2, wherein the first and second connection conductors are formed such that the seed layer includes a first layer comprising a sputtered film and a second layer comprising a sputtered film and formed on the first layer, that the first layer includes an alloy comprising copper, aluminum, and a metal, and that the second layer includes copper.

5. The printed wiring board according to claim 1, wherein the seed layer in the first and second connection via conductors is formed such that the first portion and the second portion are formed in a same process.

6. The printed wiring board according to claim 1, wherein the seed layer in the first and second connection via conductors is formed such that the seed layer on the inner wall surface has a step-shaped cross section.

7. The printed wiring board according to claim 1, wherein the seed layer in the first and second connection via conductors is formed such that the seed layer includes a first layer covering the inner wall surface and a second layer formed on the first layer and that the first layer includes the first portion and the second portion of the seed layer.

8. The printed wiring board according to claim 7, wherein the first layer of the seed layer has a step-shaped cross section.

9. The printed wiring board according to claim 1, wherein the resin insulating layer includes resin, first inorganic particles having flat parts, and second inorganic particles such that the inner wall surface of each of the openings has the resin and the flat parts of the first inorganic particles.

10. The printed wiring board according to claim 9, wherein the resin insulating layer is formed such that the inner wall surface of each of the openings has steps formed between the resin and the flat parts of the first inorganic particles.

11. The printed wiring board according to claim 9, wherein the resin insulating layer is formed such that the first inorganic particles include an oxygen element.

12. The printed wiring board according to claim 9, wherein the forming the resin insulating layer includes forming the second inorganic particles having protruding portions protruding from the resin forming the inner wall surface of the opening, and removing the protruding portions of the second inorganic particles such that the inner wall surface of each of the openings includes exposed surfaces of the first inorganic particles is formed.

13. The printed wiring board according to claim 1 further comprising:
an adhesive layer formed between the connection conductor layer and the resin insulating layer such that the adhesive layer is in contact with the connection conductor layer and the resin insulating layer.

14. The printed wiring board according to claim 13, wherein the adhesive layer is an adhesive film having a smooth part and a protruding part protruding from the smooth part.

15. The printed wiring board according to claim 1, wherein the connection conductor layer is formed such that the connection wirings are formed substantially parallel to each other and include a connection wiring having a smallest width in a range of 1 μm to 3 μm and that a smallest space between adjacent connection wirings has a width in a range of 1 μm to 3 μm.

16. The printed wiring board according to claim 1, wherein the first and second connection conductors are formed such that the seed layer includes a first layer comprising a sputtered film and a second layer comprising a sputtered film and formed on the first layer, that the first layer includes an alloy comprising copper, aluminum, and a metal, and that the second layer includes copper.

17. The printed wiring board according to claim 16, wherein the metal in the alloy of the first layer includes silicon.

18. The printed wiring board according to claim 1, wherein the resin insulating layer includes resin, first inorganic particles having flat parts, and second inorganic particles such that the inner wall surface of each of the openings has the resin and the flat parts of the first inorganic particles.

19. The method of manufacturing a printed wiring board according to claim 18, wherein the forming the resin insulating layer includes forming inorganic particles having protruding portions protruding from the resin forming the inner wall surface of the opening, and removing the protruding portions of the inorganic particles such that the first inorganic particles are formed on the inner wall surface of each of the openings.

20. A method of manufacturing a printed wiring board, comprising:

forming a connection conductor layer comprising a plurality of connection wirings;

forming a resin insulating layer on the connection conductor layer such that the resin insulating layer has a plurality of openings;

forming a mounting conductor layer on the resin insulating layer such that the mounting conductor layer includes a plurality of first electrodes and a plurality of second electrodes; and forming a plurality of connection via conductors including a plurality of first connection via conductors and a plurality of second connection via conductors in the resin insulating layer such that the first and second connection via conductors include a seed layer and an electrolytic plating layer formed on the seed layer, the first connection via conductors electrically connect the first electrodes and the connection wirings, and the second connection via conductors electrically connect the second electrodes and the connection wirings, wherein the mounting conductor layer is formed such that the plurality of first electrodes is positioned to mount a first electronic component and that the plurality of second electrodes is positioned to mount a second electronic component, and the first and second connection via conductors are formed such that the seed layer is covering an inner wall surface of each of the openings in the resin insulating layer and has a first portion and a second portion connected to the first portion and having a part of the first portion formed on the second portion.

* * * * *